US012775755B2

(12) United States Patent
Chen et al.

(10) Patent No.: US 12,775,755 B2
(45) Date of Patent: Oct. 27, 2026

(54) SIMULATION TRAFFIC SCENARIO FILE GENERATION METHOD AND APPARATUS

(71) Applicant: Yinwang Intelligent Technologies Co., Ltd., Shenzhen (CN)

(72) Inventors: Canping Chen, Shenzhen (CN); Yuanzhi Lu, Shenzhen (CN); Jian Zhao, Shanghai (CN); Baocheng Chen, Shenzhen (CN)

(73) Assignee: YINWANG INTELLIGENT TECHNOLOGIES CO., LTD., Shenzhen (CN)

( * ) Notice: Subject to any disclaimer, the term of this patent is extended or adjusted under 35 U.S.C. 154(b) by 860 days.

(21) Appl. No.: 18/303,856

(22) Filed: Apr. 20, 2023

(65) Prior Publication Data

US 2023/0385481 A1 Nov. 30, 2023

Related U.S. Application Data

(63) Continuation of application No. PCT/CN2020/122350, filed on Oct. 21, 2020.

(51) Int. Cl.
*G06F 30/20* (2020.01)
*G07C 5/02* (2006.01)
(Continued)

(52) U.S. Cl.
CPC ............... *G06F 30/20* (2020.01); *G07C 5/02* (2013.01); *B60W 30/09* (2013.01); *B60W 60/001* (2020.02);
(Continued)

(58) Field of Classification Search
CPC ...... G06F 30/20; G06F 2111/10; G06F 30/15; G07C 5/02; B60W 30/09; B60W 60/001; B60W 60/0027
See application file for complete search history.

(56) References Cited

U.S. PATENT DOCUMENTS

| | | | | |
|---|---|---|---|---|
| 10,831,636 | B2 * | 11/2020 | Morley | G06F 11/3608 |
| 2017/0343370 | A1 * | 11/2017 | Giurgiu | G01C 21/3492 |
| 2022/0126878 | A1 * | 4/2022 | Moustafa | B60W 60/0013 |

FOREIGN PATENT DOCUMENTS

| | | | |
|---|---|---|---|
| CN | 107678306 | A | 2/2018 |
| CN | 109993849 | A | 7/2019 |

(Continued)

OTHER PUBLICATIONS

Zhao, Li, and Jian Sun. "Simulation framework for vehicle platooning and car-following behaviors under connected-vehicle environment." Procedia-Social and Behavioral Sciences 96 (2013): 914-924. (Year: 2013).*

(Continued)

*Primary Examiner* — Chuen-Meei Gan
(74) *Attorney, Agent, or Firm* — Conley Rose, P.C.

(57) ABSTRACT

A simulation traffic scenario file generation method includes obtaining drive test data, where the drive test data includes traffic scenario data collected when an autonomous vehicle performs a driving test on a real road; determining a first moment at which the autonomous vehicle enters a first driving state or generates a request for entering the first driving state during the driving test; determining first clip data from the drive test data based on the first moment and ego vehicle information of the autonomous vehicle during the driving test; and generating a description file of a simulation traffic scenario based on at least the first clip data.

20 Claims, 13 Drawing Sheets

(51) Int. Cl.
*B60W 30/09* (2012.01)
*B60W 60/00* (2020.01)

(52) U.S. Cl.
CPC ....... *B60W 60/005* (2020.02); *B60W 2520/10* (2013.01); *B60W 2554/802* (2020.02)

(56) References Cited

FOREIGN PATENT DOCUMENTS

| | | | |
|---|---|---|---|
| CN | 110717248 | A | 1/2020 |
| CN | 110795818 | A | 2/2020 |
| CN | 110795819 | A | 2/2020 |
| CN | 111159833 | A | 5/2020 |

OTHER PUBLICATIONS

Chen Huiyan et al, Theory and Design of Unmanned Ground Vehicle, Beijing Institute of Technology Press, Mar. 2018, total 12 pages, with English Translation.

* cited by examiner

SIMULATION TRAFFIC SCENARIO FILE GENERATION METHOD AND APPARATUS

CROSS-REFERENCE TO RELATED APPLICATIONS

This is a continuation of International Patent Application No. PCT/CN2020/122350 filed on Oct. 21, 2020, the disclosure of which is hereby incorporated by reference in its entirety.

TECHNICAL FIELD

This application relates to the autonomous driving field, furthermore, to a simulation traffic scenario file generation method and apparatus.

BACKGROUND

A highly intelligent autonomous driving system is a necessary configuration for full or partial driving automation, and is a complex system including a plurality of modules such as positioning, sensor fusion, decision-making and planning, and control modules. An autonomous driving algorithm is a core algorithm of the autonomous driving system, is equivalent to a brain of an autonomous vehicle, and has a crucial impact on the safety and intelligence of the autonomous vehicle. Therefore, testing an autonomous driving algorithm for testing and verification and for iteration or update is one of the important research interests in the autonomous driving field.

How to perform a full and complete test on an autonomous driving system to improve a capability of the autonomous driving system to cope with a complex driving scenario is an urgent problem to be resolved currently.

SUMMARY

Embodiments of this application provide a simulation traffic scenario file generation method to reproduce a key traffic scenario in a drive test.

According to a first aspect, a simulation traffic scenario file generation method is provided. The method includes obtaining drive test data, where the drive test data includes traffic scenario data collected when an autonomous vehicle performs a driving test on a real road, and during the driving test, the autonomous vehicle executes a first autonomous driving algorithm; determining a first moment at which the autonomous vehicle enters a first driving state or generates a request for entering the first driving state during the driving test; determining first clip data from the drive test data based on the first moment and ego vehicle information of the autonomous vehicle during the driving test; and generating a description file of a simulation traffic scenario based on at least the first clip data, where the description file is used to construct the simulation traffic scenario when a simulation test is performed on a second autonomous driving algorithm, and the second autonomous driving algorithm is obtained by updating the first autonomous driving algorithm.

The method can be used to automatically extract data of a key traffic scenario from the drive test data, and generate the description file used to describe the simulation traffic scenario such as to reproduce a real key traffic scenario, thereby ensuring authenticity, completeness, and adequacy of a scenario tested or verified by an autonomous driving algorithm. A data amount of the description file is far less than the drive test data (generally, the data amount of the description file is less than or equal to one thousandth of the drive test data). In addition, the method can be used to quickly generate the description file of the simulation traffic scenario, which can speed up a scenario construction process. The generated description file can be used to form a scenario database, which ensures efficient utilization of the key traffic scenario in a drive test, and further accelerates iteration of the autonomous driving algorithm. The description file can be also used for construction of a new scenario and a generalization input, which provides a basis for rationality of the new scenario.

In a possible implementation, the first driving state is any one of the following: a manual driving state and an autonomous emergency braking state.

In a possible implementation, the first clip data is data collected by the autonomous vehicle in a first time period during the driving test, and the first time period includes the first moment.

In a possible implementation, the ego vehicle information includes a target tracking range of the autonomous vehicle, and when a distance between another sensing target and the autonomous vehicle is less than the target tracking range, the autonomous vehicle determines the another sensing target as a tracking target. The determining first clip data from the drive test data based on the first moment and ego vehicle information of the autonomous vehicle during the driving test includes determining a second moment based on the target tracking range and the first moment of the autonomous vehicle, where the second moment is earlier than the first moment, and a distance between a position of the autonomous vehicle at the second moment and a position of the autonomous vehicle at the first moment is equal to the target tracking range; and determining the second moment as a start moment of the first time period.

In a possible implementation, the ego vehicle information includes a target tracking range of the autonomous vehicle and a vehicle speed of the autonomous vehicle during the driving test, and when a distance between another sensing target and the autonomous vehicle is less than the target tracking range, the autonomous vehicle determines the another sensing target as a tracking target. The determining first clip data from the drive test data based on the first moment and ego vehicle information of the autonomous vehicle during the driving test includes determining a second moment based on the target tracking range and the first moment of the autonomous vehicle, where the second moment is earlier than the first moment, and a distance between a position of the autonomous vehicle at the second moment and a position of the autonomous vehicle at the first moment is equal to the target tracking range; and determining a start moment of the first time period based on the second moment and a first vehicle speed of the autonomous vehicle at the second moment.

In a possible implementation, the method further includes obtaining a preset acceleration; and the determining a start moment of the first time period based on the second moment and a first vehicle speed of the autonomous vehicle at the second moment includes determining the start moment based on the acceleration, the second moment, and the first vehicle speed such that a speed to which the autonomous vehicle starts to accelerate from the start moment to the second moment according to the acceleration in a case in which a start speed is zero is equal to the first vehicle speed.

In a possible implementation, the method further includes obtaining first ego vehicle information of the autonomous vehicle corresponding to the first time period; and the generating a description file of a simulation traffic scenario based on at least the first clip data includes generating the simulation traffic scenario based on the first clip data and the first ego vehicle information.

In a possible implementation, the first clip data includes a plurality of tracks corresponding to a same target category. The generating a description file of a simulation traffic scenario based on at least the first clip data includes splicing different tracks in the plurality of tracks to obtain at least one spliced track, where when a distance between an end position of a first track in the plurality of tracks and a start position of a second track in the plurality of tracks is less than a first threshold, and a time difference between an end moment of the first track and a start moment of the second track is less than a second threshold, an end point of the first track and a start point of the second track are spliced to obtain a spliced track; and generating the simulation traffic scenario based on the at least one spliced track.

According to a second aspect, an embodiment of this application provides a traffic scenario simulation method. The method includes obtaining drive test data, where the drive test data includes traffic scenario data collected when an autonomous vehicle performs a driving test on a real road, and during the driving test, the autonomous vehicle executes a first autonomous driving algorithm; determining a first moment at which the autonomous vehicle enters a first driving state or generates a request for entering the first driving state during the driving test; determining first clip data from the drive test data based on the first moment and ego vehicle information of the autonomous vehicle during the driving test; constructing a simulation traffic scenario based on at least the first clip data; and performing a simulation test on a virtual vehicle by using the simulation traffic scenario, where during the simulation test, the virtual vehicle executes a second autonomous driving algorithm, and the second autonomous driving algorithm is obtained by updating the first autonomous driving algorithm.

The method can be used to automatically extract data of a key traffic scenario from the drive test data, construct the simulation traffic scenario based on the data, and test or verify an autonomous driving algorithm such as to ensure authenticity, completeness, and adequacy of a scenario tested or verified by the autonomous driving algorithm. In addition, the method can be used to quickly construct the simulation traffic scenario, which ensures efficient utilization of the key traffic scenario in a drive test, and further accelerates iteration of the autonomous driving algorithm.

In a possible implementation, the ego vehicle information includes a target tracking range of the autonomous vehicle, the first clip data is data collected by the autonomous vehicle in a first time period during the driving test, the first time period includes the first moment and a second moment, and a distance between a position of the autonomous vehicle at the first moment and a position of the autonomous vehicle at the second moment is less than or equal to the target tracking range. The simulation traffic scenario lasts for a second time period, and duration of the second time period is equal to duration of the first time period. The performing a simulation test on a virtual vehicle by using the simulation traffic scenario includes: when the virtual vehicle is at a time point corresponding to the second moment in the second time period, determining a driving policy of the virtual vehicle based on a participating element in the simulation traffic scenario by using the second autonomous driving algorithm.

In a possible implementation, at least one data clip includes a first vehicle speed of the autonomous vehicle at the second moment. The performing a simulation test on a virtual vehicle by using the simulation traffic scenario further includes that when a start speed of the virtual vehicle is zero, accelerating according to a preset acceleration starting from a start moment of the second time period, so that a speed of the virtual vehicle at the time point corresponding to the second moment in the second time period is equal to the first vehicle speed.

According to a third aspect, an embodiment of this application provides a simulation traffic scenario file generation apparatus. The apparatus includes an obtaining unit configured to obtain drive test data, where the drive test data includes traffic scenario data collected when an autonomous vehicle performs a driving test on a real road, and during the driving test, the autonomous vehicle executes a first autonomous driving algorithm; a first determining unit configured to determine a first moment at which the autonomous vehicle enters a first driving state or generates a request for entering the first driving state during the driving test; a second determining unit configured to determine first clip data from the drive test data based on the first moment and ego vehicle information of the autonomous vehicle during the driving test; and a generation unit configured to generate a description file of a simulation traffic scenario based on at least the first clip data, where the description file is used to construct the simulation traffic scenario when a simulation test is performed on a second autonomous driving algorithm, and the second autonomous driving algorithm is obtained by updating the first autonomous driving algorithm.

In a possible implementation, the first driving state is any one of the following: a manual driving state and an autonomous emergency braking state.

In a possible implementation, the first clip data is data collected by the autonomous vehicle in a first time period during the driving test, and the first time period includes the first moment.

In a possible implementation, the ego vehicle information includes a target tracking range of the autonomous vehicle, and when a distance between another sensing target and the autonomous vehicle is less than the target tracking range, the autonomous vehicle determines the another sensing target as a tracking target. The second determining unit is further configured to: determine a second moment based on the target tracking range and the first moment of the autonomous vehicle, where the second moment is earlier than the first moment, and a distance between a position of the autonomous vehicle at the second moment and a position of the autonomous vehicle at the first moment is equal to the target tracking range; and determine the second moment as a start moment of the first time period.

In a possible implementation, the ego vehicle information includes a target tracking range of the autonomous vehicle and a vehicle speed of the autonomous vehicle during the driving test, and when a distance between another sensing target and the autonomous vehicle is less than the target tracking range, the autonomous vehicle determines the another sensing target as a tracking target. The second determining unit is further configured to determine a second moment based on the target tracking range and the first moment of the autonomous vehicle, where the second moment is earlier than the first moment, and a distance between a position of the autonomous vehicle at the second moment and a position of the autonomous vehicle at the first moment is equal to the target tracking range; and determine a start moment of the first time period based on the second moment and a first vehicle speed of the autonomous vehicle at the second moment.

In a possible implementation, the obtaining unit is further configured to obtain a preset acceleration; and the second determining unit is further configured to determine the start moment based on the acceleration, the second moment, and the first vehicle speed, so that a speed to which the autonomous vehicle starts to accelerate from the start moment to the second moment according to the acceleration in a case in which a start speed is zero is equal to the first vehicle speed.

In a possible implementation, the obtaining unit is further configured to obtain first ego vehicle information of the autonomous vehicle corresponding to the first time period; and the generation unit is further configured to generate the simulation traffic scenario based on the first clip data and the first ego vehicle information.

In a possible implementation, the first clip data includes a plurality of tracks corresponding to a same target category; and the generation unit is further configured to splice different tracks in the plurality of tracks to obtain at least one spliced track, where when a distance between an end position of a first track in the plurality of tracks and a start position of a second track in the plurality of tracks is less than a first threshold, and a time difference between an end moment of the first track and a start moment of the second track is less than a second threshold, an end point of the first track and a start point of the second track are spliced to obtain a spliced track; and generate the simulation traffic scenario based on the at least one spliced track.

According to a fourth aspect, an embodiment of this application provides a traffic scenario simulation apparatus. The apparatus includes an obtaining unit configured to obtain drive test data, where the drive test data includes traffic scenario data collected when an autonomous vehicle performs a driving test on a real road, and during the driving test, the autonomous vehicle executes a first autonomous driving algorithm; a first determining unit, configured to determine a first moment at which the autonomous vehicle enters a first driving state or generates a request for entering the first driving state during the driving test; a second determining unit, configured to determine first clip data from the drive test data based on the first moment and ego vehicle information of the autonomous vehicle during the driving test; a construction unit, configured to construct a simulation traffic scenario based on at least the first clip data; and a test unit, configured to perform a simulation test on a virtual vehicle by using the simulation traffic scenario, where during the simulation test, the virtual vehicle executes a second autonomous driving algorithm, and the second autonomous driving algorithm is obtained by updating the first autonomous driving algorithm.

In a possible implementation, the ego vehicle information includes a target tracking range of the autonomous vehicle, the first clip data is data collected by the autonomous vehicle in a first time period during the driving test, the first time period includes the first moment and a second moment, and a distance between a position of the autonomous vehicle at the first moment and a position of the autonomous vehicle at the second moment is less than or equal to the target tracking range. The simulation traffic scenario lasts for a second time period, and duration of the second time period is equal to duration of the first time period. The test unit is further configured to: when the virtual vehicle is at a time point corresponding to the second moment in the second time period, determine a driving policy of the virtual vehicle based on a participating element in the simulation traffic scenario by using the second autonomous driving algorithm.

In a possible implementation, at least one data clip includes a first vehicle speed of the autonomous vehicle at the second moment. The test unit is further configured to: when a start speed of the virtual vehicle is zero, accelerate according to a preset acceleration starting from a start moment of the second time period such that a speed of the virtual vehicle at the time point corresponding to the second moment in the second time period is equal to the first vehicle speed.

According to a fifth aspect, an embodiment of this application provides a computing device including a processor and a memory. The memory is configured to store computer instructions. When the computing device runs, the processor executes the computer instructions, so that the computing device performs the method provided in the first aspect.

According to a sixth aspect, an embodiment of this application provides a computing device, including a processor and a memory. The memory is configured to store computer instructions. When the computing device runs, the processor executes the computer instructions, so that the computing device performs the method provided in the second aspect.

According to a seventh aspect, an embodiment of this application provides a computer storage medium. The computer storage medium includes computer instructions. When the computer instructions are run on an electronic device, the electronic device is enabled to perform the method provided in the first aspect.

According to an eighth aspect, an embodiment of this application provides a computer storage medium. The computer storage medium includes computer instructions. When the computer instructions are run on an electronic device, the electronic device is enabled to perform the method provided in the second aspect.

According to a ninth aspect, an embodiment of this application provides a computer program product. When program code included in the computer program product is executed by a processor in an electronic device, the method provided in the first aspect is implemented.

According to a tenth aspect, an embodiment of this application provides a computer program product. When program code included in the computer program product is executed by a processor in an electronic device, the method provided in the second aspect is implemented.

The solutions provided in the embodiments of this application can be used to automatically extract data of a key traffic scenario from drive test data, and generate a description file used to describe a simulation traffic scenario such as to reproduce the key traffic scenario, thereby ensuring authenticity, completeness, and adequacy of a scenario tested or verified by an autonomous driving algorithm.

DESCRIPTION OF EMBODIMENTS

Figure 1:
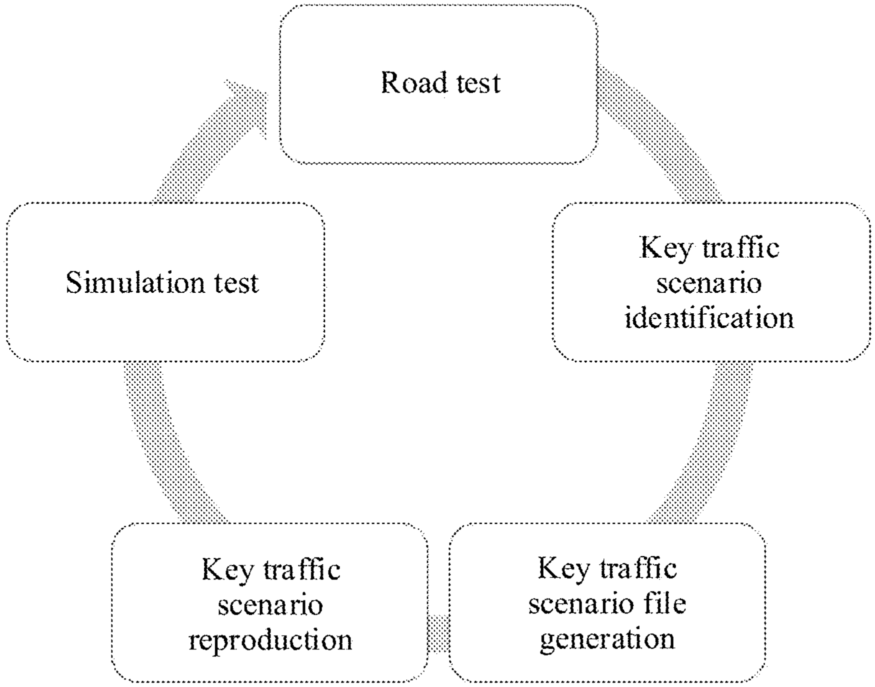
FIG. 1 is a schematic diagram of a concept of simulation traffic scenario file generation and application according to an embodiment of this application.

The following describes technical solutions in embodiments of the present disclosure with reference to the accompanying drawings. It is clearly that the described embodiments are merely some but not all of the embodiments of this application.

In the descriptions of this application, orientations or position relationships indicated by the terms “center”, “up”, “down”, “front”, “rear”, “left”, “right”, “vertical”, “horizontal”, “top”, “bottom”, “inside”, “outside”, and the like are based on orientations or position relationships shown in the accompanying drawings, and are merely intended to describe this application and simplify the descriptions, but are not intended to indicate or imply that an apparatus or an element shall have a specific orientation or be formed and operated in a specific orientation, and therefore shall not be understood as a limitation on this application.

In the descriptions of this application, it should be noted that, unless otherwise expressly specified and limited, terms “mounting”, “connected”, and “connection” shall be understood in a broad sense. For example, the connection may be a fixed connection, may be a detachable connection, or may further be an abutting connection or an integrated connection. A person of ordinary skill in the art may understand specific meanings of the terms in this application based on specific situations.

In the descriptions of this application, the described specific features, structures, materials, or features may be combined in a proper manner in any one or more of the embodiments or examples.

A test manner of an autonomous driving system algorithm is to discover a weakness of the autonomous driving system algorithm through a drive test such as to perform algorithm iteration or update. The drive test may also be referred to as a road test, or may be referred to as a driving test or an actual driving test, and is to perform an actual or real driving test on an open road. Drive test costs are relatively high, and a complex driving scenario or a traffic scenario that the autonomous driving system algorithm cannot cope with is difficult to reproduce, or costs of reproduction or approximate reproduction are relatively high. The autonomous driving system algorithm may also be referred to as an autonomous driving algorithm.

Another test manner of the autonomous driving system algorithm is to perform a simulation test. The simulation test is to construct a simulation traffic scenario by using a computer, and perform a simulation driving test in the simulation traffic scenario. Currently, a plurality of simulation test technologies such as software in loop (SIL), model in loop (VIL), and hardware in loop (HIL) are available to test an autonomous driving system. These simulation test technologies are used to enable an autonomous vehicle to make a more reasonable decision when facing a real traffic scenario in the future. The simulation test needs to construct the simulation traffic scenario. Because potential traffic scenarios for the autonomous vehicle are unlistable and behaviors of traffic participants are unpredictable, a manually constructed simulation traffic scenario covers a few traffic scenarios, and the manually constructed simulation traffic scenario is not realistic. The traffic participant may be an object around the autonomous vehicle, for example, a pedestrian, another vehicle, a traffic signal light, or another vehicle. The behavior of the traffic participant may refer to an action of the traffic participant. For example, the behavior of the traffic participant may include a behavior in which the traffic participant is static relative to the ground and a behavior in which the traffic participant is dynamic relative to the ground. The behavior in which the traffic participant is dynamic relative to the ground may include a movement direction, a movement speed, or the like of the traffic participant.

An embodiment of this application provides a simulation traffic scenario file generation method. The method can be used to identify, based on a change of a vehicle driving state, data corresponding to a key traffic scenario from drive test data, and generate a simulation traffic scenario based on the data corresponding to the key traffic scenario such as to test an iterated or updated autonomous driving decision algorithm.

The key traffic scenario may be the foregoing complex driving scenario or the traffic scenario that the autonomous driving algorithm cannot cope with. The simulation traffic scenario file may be a description file of a traffic scenario. An electronic device having a data processing function may reproduce the traffic scenario in a virtual or simulated manner based on the description file.

The drive test data may include sensed data obtained by a sensing and measurement system of an autonomous vehicle during a drive test of the autonomous vehicle. The sensing and measurement system may also be referred to as a perception system. The sensing and measurement system may include a sensing device such as a radar or a camera, and may sense an external environment of the autonomous vehicle such as to obtain the sensed data. In this embodiment of this application, the autonomous vehicle may be referred to as an ego vehicle for short, and another object (for example, a pedestrian, another vehicle other than the ego vehicle, or a traffic signal light) other than the ego vehicle sensed by the sensing and measurement system is called a sensing target. The radar may use a radio signal to sense a speed, a traveling direction, a position, and the like of the sensing target. The camera may be a still camera or a video camera, and may be used to capture an image of an ambient environment of the ego vehicle. A computer vision system in the ego vehicle may analyze the image captured by the camera, so as to sense a shape, a type, a speed, a position, and the like of the sensing target in the ambient environment of the ego vehicle.

The drive test data may further include geographical location information obtained by a positioning system of the autonomous vehicle during the drive test of the ego vehicle. The positioning system may be a Global Positioning System (GPS), or may be a BeiDou navigation satellite system (BDS).

The drive test data may further include ego vehicle information during the drive test of the ego vehicle, for example, a traveling speed and a traveling direction of the ego vehicle. For example, the ego vehicle information may be obtained through sensing by a sensing and measurement system that includes an inertial measurement unit (IMU).

In some embodiments, the drive test data may further include a moment at which the ego vehicle enters (or switches to) a driving state A1 and/or a moment at which a request for entering (or switching to) the driving state A1 is generated during the drive test of the ego vehicle. The moment at which the ego vehicle enters (or switches to) the driving state A1 and/or the moment at which the request for entering (or switching to) the driving state A1 is generated during the drive test of the ego vehicle may also be referred to as a key moment or an occurrence moment of the key traffic scenario. It may be understood that the ego vehicle may record the key moment or the occurrence moment of the key traffic scenario, and store the key moment or the occurrence moment as a part of the drive test data.

For example, the driving state A1 may be a manual driving state, or may be an autonomous emergency braking (AEB) state. The manual driving state refers to a state in which manual driving is performed without autonomous driving. The autonomous emergency braking state refers to a state in which autonomous emergency braking is performed.

For example, the moment at which the request for entering the driving state A1 is generated may refer to an occurrence moment of active disengagement (ADE). The active disengagement refers to a process in which the autonomous vehicle (ego vehicle) generates and sends a manual driving takeover request when detecting a driving hazard that the autonomous vehicle cannot cope with, to request a driver to manually drive the vehicle. That is, the active disengagement means that the ego vehicle actively requests to switch from an autonomous driving state to the manual driving state. In this embodiment of this application, the occurrence moment of the active disengagement may refer to a moment at which the ego vehicle generates the manual driving takeover request. It may be understood that the ego vehicle may record the occurrence moment of the active disengagement, and store the occurrence moment of the active disengagement as a part of the drive test data.

For example, the moment of entering the driving state A1 may refer to an occurrence moment of passive disengagement (PDE). The passive disengagement refers to a process in which the driver in the ego vehicle or a tester in the ego vehicle actively takes over driving when detecting a driving hazard but the ego vehicle does not recognize the hazard or does not perform a related operation on the hazard during the drive test. That is, the passive disengagement refers to a process of manually discovering a hazard and manually enabling the ego vehicle to actively exit the autonomous driving state and enter the manual driving state. The occurrence moment of the passive disengagement refers to a moment at which the ego vehicle switches from the autonomous driving state to the manual driving state. It may be understood that the ego vehicle may record the occurrence moment of the passive disengagement, and store the occurrence moment of the passive disengagement as a part of the drive test data.

In some embodiments, the drive test data may include different driving states of the ego vehicle during the drive test of the ego vehicle, for example, the autonomous driving state, the manual driving state, or the autonomous emergency braking state. Therefore, in a subsequent step, a switching time between different driving states may be determined based on the different driving states of the ego vehicle.

The foregoing describes the drive test data only as an example, and does not constitute a limitation. The drive test data may further include other data. For details, refer to descriptions of drive test data obtained through a vehicle drive test in the conventional technology. Details are not described herein again.

Next, in different embodiments, the simulation traffic scenario file generation method provided in this embodiment of this application is described.

FIG. 1 shows a concept of simulation traffic scenario file generation and application according to an example embodiment. In some embodiments, an actual road test, namely, a drive test, may be performed on an ego vehicle on which an autonomous driving algorithm B1 is configured. During the drive test, the ego vehicle executes the autonomous driving algorithm B1. In other words, the road test is a test on the autonomous driving algorithm B1. Drive test data can be obtained through the road test. It may be understood that the road test usually lasts for a long time or is performed for a long distance, and the drive test data includes a large amount of data. Big data analysis can be performed on the drive test data to identify a key traffic scenario. Then, a key traffic scenario file is generated based on data corresponding to the key traffic scenario in the drive test data. After that, the key traffic scenario can be reproduced on a simulation test platform (such as a software in loop test platform, a model in loop test platform, or a hardware in loop test platform) based on the key traffic scenario file, so as to perform a simulation test on an autonomous driving algorithm B2. The autonomous driving algorithm B2 may be an autonomous driving algorithm obtained after the autonomous driving algorithm is updated or upgraded. In a case in which a test result of the simulation test is relatively ideal, the road test may be performed on the autonomous driving algorithm B2. In this way, the foregoing process is repeated, to obtain an autonomous driving algorithm that can cope with a plurality of complex driving scenarios.

Figure 2:
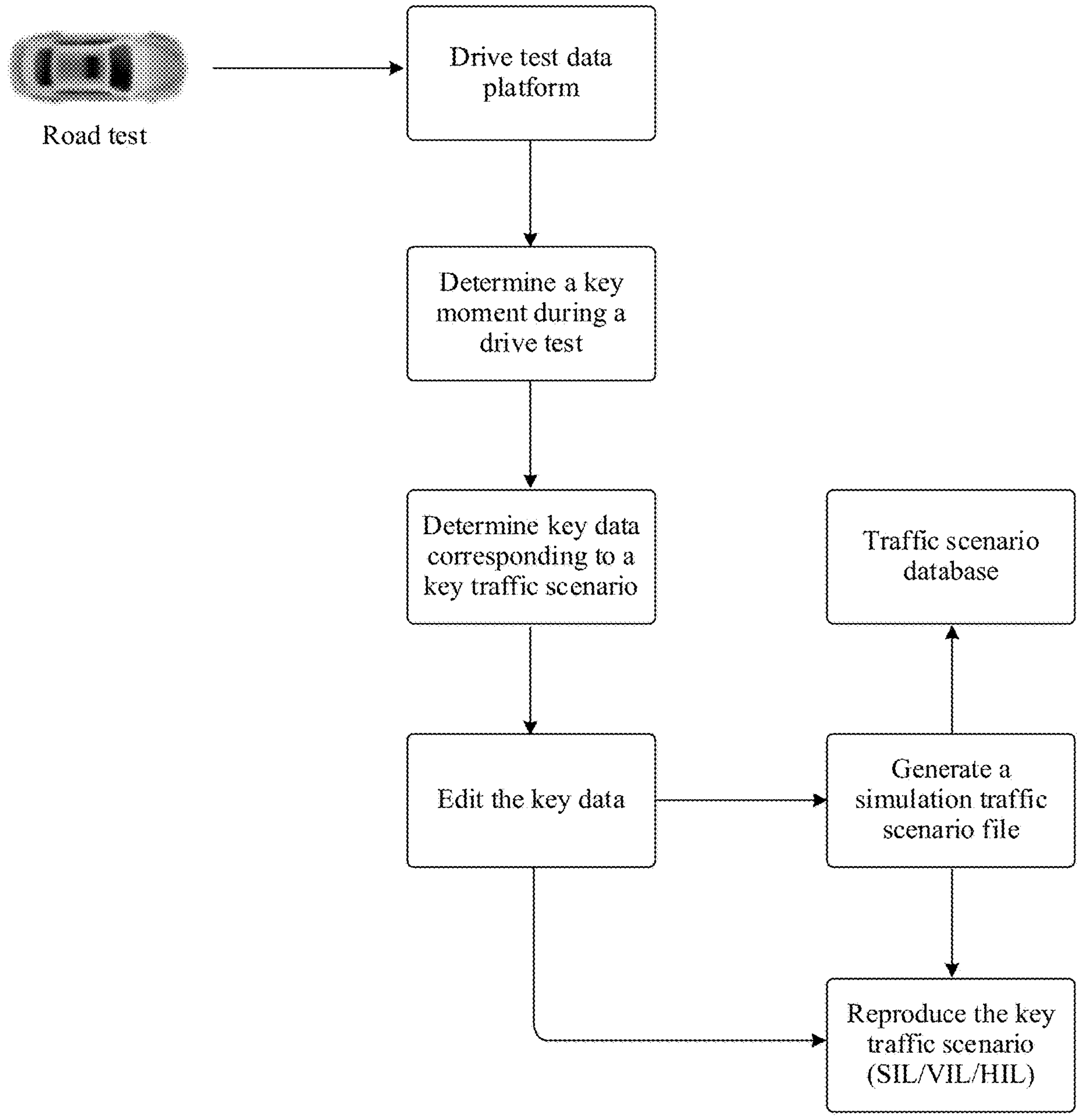
FIG. 2 is a flowchart of a key traffic scenario reproduction solution according to an embodiment of this application.

FIG. 2 shows a flowchart of a key traffic scenario reproduction solution according to an example embodiment. In some embodiments, drive test data generated by performing a road test on an ego vehicle may be stored on a drive test data platform. The drive test data platform may be one or more computing devices that have data storage and processing capabilities, for example, a server or a server cluster. When generating a simulation traffic scenario, the drive test data can be obtained from the drive test data platform. A key moment during a drive test may be determined based on the drive test data, and data corresponding to a key traffic scenario may be determined based on the key moment. For ease of description, the data corresponding to the key traffic scenario may be referred to as key data. For example, the key data may be further edited. The edited key data can be used as or used to generate a simulation traffic scenario file. The simulation traffic scenario file can be used to reproduce the key traffic scenario on a simulation test platform (such as a software in loop test platform, a model in loop test platform, or a hardware in loop test platform), so as to perform a simulation test on an updated or iterated autonomous driving algorithm. The simulation traffic scenario file may be stored in a traffic scenario database for subsequent use.

Next, in different embodiments, an example in which an execution body is a computing device C1 and an ego vehicle is a vehicle D1 is used to describe a solution for determining data corresponding to a key traffic scenario from drive test data. The computing device C1 may be any apparatus, device, platform, or device cluster that has data computing and processing capabilities.

Figure 3:
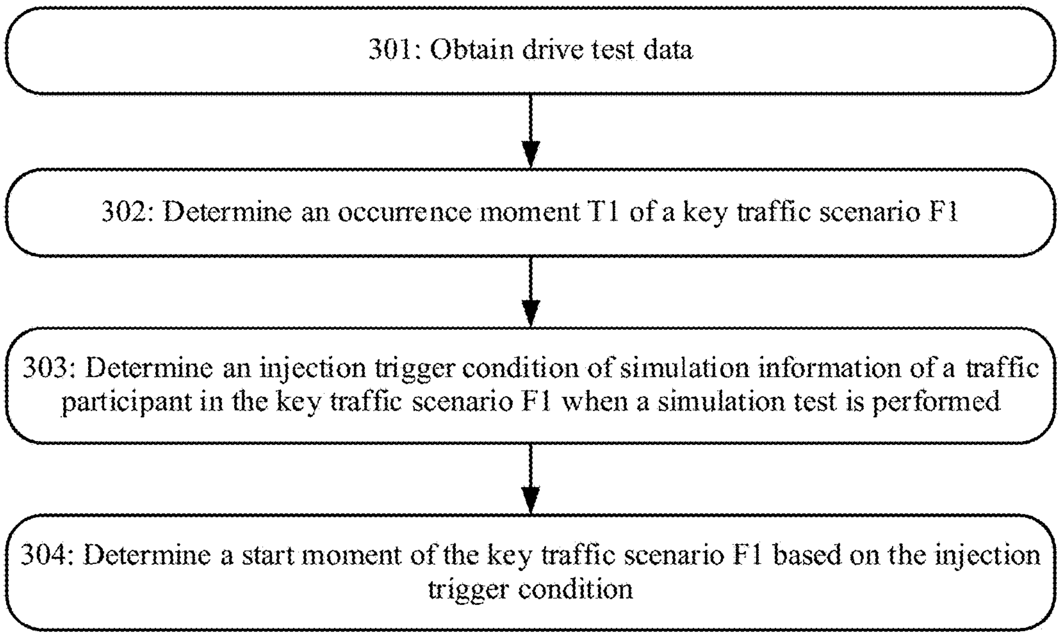
FIG. 3 is a flowchart of determining data corresponding to a key traffic scenario according to an embodiment of this application.

In some embodiments, refer to FIG. 3, the computing device C1 may perform step 301 to obtain the drive test data. For example, the computing device C1 may obtain the drive test data from a drive test data platform. The drive test data may be drive test data obtained when the vehicle D1 performs a road test by executing an autonomous driving algorithm B1.

Then, the computing device C1 may perform step 302 to determine an occurrence moment T1 of a key traffic scenario F1 based on the drive test data. According to the foregoing description, the drive test data may include a moment at which the vehicle D1 enters (or switches to) a driving state A1 and/or a moment at which a request for entering (or switching to) the driving state A1 is generated during a drive test of the ego vehicle, that is, the occurrence moment T1 of the key traffic scenario. Therefore, the computing device C1 may determine the occurrence moment T1 of the key traffic scenario F1 based on the drive test data.

Next, the computing device C1 may perform step 303 to determine an injection trigger condition of simulation information of a sensing target in the key traffic scenario F1 when a simulation test is performed.

When the simulation test is performed on a computing device C2, when the computing device C2 detects that a simulation vehicle meets the injection trigger condition, the computing device C2 may inject, into a simulation traffic scenario, the simulation information of the sensing target in the key traffic scenario. In other words, when the simulation vehicle meets the injection trigger condition, the computing device C2 may present, in the simulation traffic scenario, the simulation information of the sensing target in the key traffic scenario F1. It should be noted that the simulation information of the sensing target in the key traffic scenario is a sensing target when a simulation traffic scenario that is generated after a data clip corresponding to the key traffic scenario in the drive test data is processed in a subsequent step is reproduced. Therefore, the simulation information of the sensing target may also be referred to as a simulation sensing target. The simulation vehicle may be a vehicle obtained by simulating the vehicle D1 on which the autonomous driving algorithm B2 is executed. The autonomous driving algorithm B2 is obtained after the autonomous driving algorithm B1 is updated or iterated.

For example, the injection trigger condition may include geographical location information. The geographical location information may be represented by using a high definition map. Geographical location information of the vehicle D1 in the drive test data may be represented by using the high definition map. When the simulation test is performed on the computing device C2, a geographical location or a simulated geographical location of the simulation vehicle during the simulation test is also represented by using the high definition map. Therefore, a geographical location in the drive test data or in the key traffic scenario and a geographical location during the simulation test may be represented in a unified manner.

It may be understood that, although a sensing and measurement system of the vehicle D1 may sense a sensing target at a relatively long distance (within an effective sensing range), the vehicle D1 usually focuses on a sensing target within an appropriate distance during driving. For example, the vehicle D1 does not need to focus on a sensing target 1000 or more meters away from the vehicle D1, but only needs to focus on a sensing target 100 or less meters away from the vehicle D1. To simulate a real road test as much as possible, during the simulation test, the simulation vehicle makes a decision by using the autonomous driving algorithm B2 based on information of a sensing target that is noticed during the road test of the vehicle D1, so as to test whether the autonomous driving algorithm B2 can cope with the key traffic scenario F1, to be specific, to test whether the vehicle, in the key traffic scenario F1, also enters the driving state A1 or generates the request for entering the driving state A1 at a moment T'1 if the autonomous driving algorithm B2 is executed. When the simulation vehicle is in the geographical location information included in the injection trigger condition, the simulation sensing target may enable the simulation vehicle to sense or simulate the sensing target sensed by the vehicle D1 during the road test.

The moment T'1 is a simulation moment corresponding to the moment T1. The simulation moment refers to a simulated or virtual moment corresponding to an actual moment during the drive test. For example, if the road test actually occurs between 14:00 and 16:00 on Jan. 1, 2020, and the moment T1 is 14:51 on Jan. 1, 2020, the simulation moment, namely, the moment T'1 is 14:51 on Jan. 1, 2020 that is virtual or simulated in the computer. Even though the simulation test is actually performed at a later time (May 1, 2020), the simulation moment in a simulation scenario constructed by the simulation test is 14:51 on Jan. 1, 2020.

For example, a target tracking range is provided in this embodiment of this application. When the sensing target is in a target tracking range of the vehicle D1, in other words, when a distance between the sensing target and the vehicle D1 is less than the target tracking range, the vehicle D1 determines the sensing target as a tracking target, so as to focus on the sensing target. The target tracking range belongs to ego vehicle information of the vehicle D1.

In some embodiments, in step 303, the injection trigger condition may be determined based on the ego vehicle information of the vehicle D1 and the moment T1.

In a first illustrative example of these embodiments, the ego vehicle information may include the target tracking range. In step 303, a geographical location in the injection trigger condition is determined. In some embodiments, a geographical location E1 of the vehicle D1 in the drive test data at the moment T1 may be determined. Then, a geographical location E2 whose distance from the geographical location E1 is equal to the target tracking range and that is located in front of the geographical location E1 is determined, and the geographical location E2 is used as the geographical location in the injection trigger condition. The geographical location in front of the geographical location E1 is a geographical location before the vehicle D1 arrives at the geographical location E1 when the vehicle D1 performs the road test.

In a second illustrative example of these embodiments, the ego vehicle information may include a vehicle speed of the vehicle D1 at each moment during the road test. It may be understood that, to simulate a real road test as much as possible, during the simulation test, when the simulation vehicle makes a decision by using the autonomous driving algorithm B2 based on the information of the sensing target that is noticed during the road test of the vehicle D1, a speed of the simulation vehicle shall be or is preferably equal to or close to a speed at a corresponding moment during the road test. Therefore, in step 303, the geographical location and a vehicle speed in the injection trigger condition may be determined.

For the geographical location in the injection trigger condition, refer to the descriptions in the first illustrative example. The vehicle speed in the injection trigger condition is a vehicle speed when the vehicle D1 arrives at the geographical location in the injection trigger condition during the road test. During specific implementation of step 303, the geographical location in the injection trigger condition may be first determined, then a moment at which the vehicle D1 arrives at the geographical location may be determined, and then the vehicle speed when the vehicle D1 arrives at the geographical location may be determined. In this way, the vehicle speed in the injection trigger condition may be obtained.

According to the foregoing description, in the solution of this embodiment of this application, a data clip of specific duration is intercepted or determined from the drive test data, and the data clip is used to generate the simulation traffic scenario file or a description file of the simulation traffic scenario. The data clip of specific duration is data corresponding to the key traffic scenario F1. Therefore, to obtain the data clip used to generate the simulation traffic scenario file, a start moment and an end moment of the specific duration need to be determined. For ease of description, the start moment of the specific duration may be referred to as a start moment of the key traffic scenario F1, and the end moment of the specific duration may be referred to as an end moment of the key traffic scenario F1.

Next, a solution for determining a start moment is described.

Still refer to FIG. 3. The computing device C1 may perform step 304 to determine the start moment of the key traffic scenario F1 based on the injection trigger condition determined in step 303.

In some embodiments, the injection trigger condition may include the geographical location. In step 304, the start moment of the key traffic scenario F1 may be determined based on the geographical location included in the injection trigger condition. In some embodiments, during the road test, a moment at which the vehicle D1 arrives at the geographical location included in the injection trigger condition may be determined as the start moment of the key traffic scenario F1.

In some embodiments, the injection trigger condition may include the geographical location and the vehicle speed. In step 304, the start moment of the key traffic scenario F1 may be determined based on the geographical location and the vehicle speed that are included in the injection trigger condition. For example, an acceleration of the simulation vehicle may be preset. The acceleration may be 1 m/s^2, 1.5 m/s^2, 2 m/s^2, or the like. The start moment of the key traffic scenario F1 may be determined based on the acceleration and the vehicle speed included in the injection trigger condition. In some embodiments, duration T2 required for a vehicle to accelerate according to the acceleration from zero speed to the vehicle speed included in the injection trigger condition may be determined. In an example, the duration T2 may be determined according to the following formula:

$$T2 = \text{Vehicle speed included in the injection trigger condition/Preset acceleration.}$$

Then, the start moment may be determined based on the duration T2 and the moment T1. In some embodiments, a moment T3 that is before the moment T1 and that is at a time interval of the duration T2 from the moment T1 may be determined as the start moment.

In this embodiment, three time points of a traffic scenario may be involved, which are respectively a start moment, an injection moment, and an end moment. The injection moment is a moment at which the simulation vehicle is located in the geographical location included in the injection trigger condition when the simulation test is performed. As described above, the geographical location in the drive test data and the geographical location in the simulation test are represented by using the high definition map, and a time used for the simulation test is also a simulation of a road test time. Therefore, the moment at which the simulation vehicle in the simulation test is located in the geographical location included in the injection trigger condition is the same as a moment at which the vehicle D1 in the road test is located in the geographical location. In addition, because the time used for the simulation test is also the simulation of the road test time, a start moment and an end moment may be a start moment and an end moment of the simulation traffic scenario during the simulation test.

Figure 4:
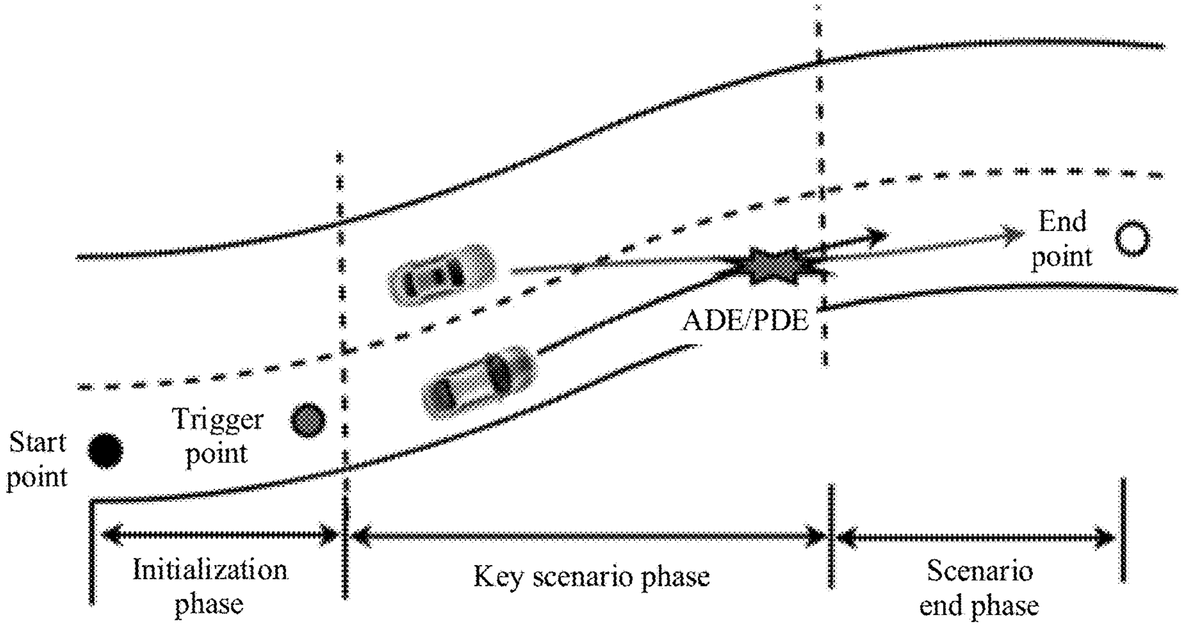
FIG. 4 is a schematic diagram of different phases of a simulation traffic scenario according to an embodiment of this application.

For example, refer to FIG. 4. During the simulation test, a phase from the start moment to the injection moment may be referred to as an initialization phase. In this phase, the simulation vehicle may accelerate, and at the injection moment, the vehicle speed included in the injection trigger condition is reached. This can adapt to a simulation test platform that requires the simulation vehicle to start from 0. At the injection moment, the simulation information of the sensing target in the key traffic scenario F1 may be injected into the simulation traffic scenario. A phase from the injection moment to the moment T1 (or the simulation moment of the moment T1) is referred to as a key scenario phase. In the key scenario phase, it may be simulated, when the autonomous driving algorithm B2 is executed, whether a vehicle can successfully implement autonomous driving, and whether the vehicle also exits an autonomous driving state or enters an emergency braking state, so as to implement the simulation test on the autonomous driving algorithm B2.

Still refer to FIG. 4. A phase from the moment T1 (or the simulation moment of the moment T1) to the end moment may be referred to as a scenario end phase.

In some embodiments, for an end moment of the key traffic scenario F1, a moment T3 that is after the moment T1 and that is at a time interval of preset duration from the moment T1 may be determined as the end moment. The preset duration may be determined based on experience, for example, 1 minute, 2 minutes, or 5 minutes.

In the foregoing manner, the start moment and the end moment may be determined, to obtain a time period. A data clip in the drive test data in the time period may be determined as the data corresponding to the key traffic scenario F1, so as to generate the simulation traffic scenario file.

In some embodiments, the data corresponding to the key traffic scenario F1 in the drive test data is directly used as the simulation traffic scenario file. When the computing device C2 is used to perform the simulation test, the computing device C2 may reproduce the key traffic scenario F1 based on the data corresponding to the key traffic scenario F1 in the drive test data, that is, present the simulation traffic scenario. For a process in which the computing device reproduces a traffic scenario based on the drive test data, refer to descriptions in the conventional technology. Details are not described herein again.

In some embodiments, further processing may be performed on the data corresponding to the key traffic scenario F1, and in particular, further processing may be performed on related information of the sensing target. The processed data may be used for the simulation traffic scenario file or the description file of the simulation traffic scenario.

Figure 5:
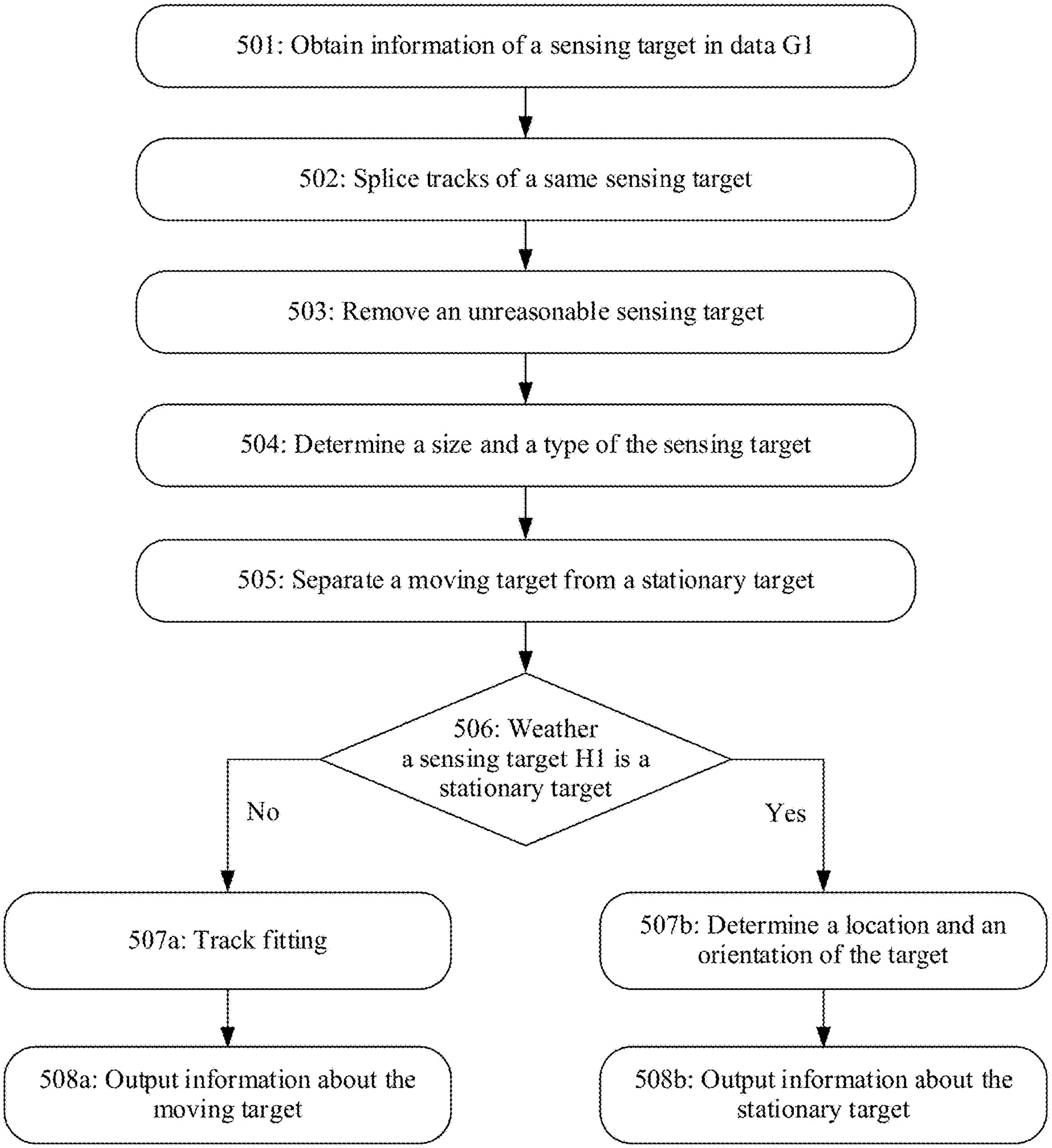
FIG. 5 is a flowchart of processing data corresponding to a key traffic scenario according to an embodiment of this application.

Next, with reference to FIG. 5, an example of processing the data corresponding to the key traffic scenario F1 is described. For ease of description, the data corresponding to the key traffic scenario F1 may be referred to as data G1 below.

Refer to FIG. 5. The computing device C1 may perform step 501 to obtain the information of the sensing target in the data G1.

The information of the sensing target may include information such as a position, a speed, a type, and a size of the sensing target.

It may be understood that for factors such as stability and accuracy of the perception system of the vehicle D1, or blocking between traffic participants (objects around the vehicle D1, such as traffic signal lights, other vehicles, or pedestrians), the information of the sensing target needs to be analyzed and extracted, so as to obtain information that is more suitable or more conducive to processing of the autonomous driving algorithm.

Still refer to FIG. 5. The computing device C1 may perform step 502 to splice tracks of a same sensing target.

In some embodiments, when sensing an object, the perception system may set an identity ID) (for example, a number) for the object. In step 502, a track of a single target may be determined based on an identity of the sensing target. A track of a single sensing target may become several discontinuous tracks due to factors such as blocking and change of a target identity. In this case, a track splicing solution based on time-space consistency is provided in this embodiment of this application, to obtain a complete track of the single target in the key traffic scenario F1. It may be understood that the track of the single target sensed by the perception system has the following features.

Feature a: A start moment of a later track is close to an end moment of a previous track.

Feature b: A start position of the later track is close to an end position of the previous track.

The foregoing features may be used to splice a track whose end point and a track whose start point are close in time (for example, a time difference between the end point and the start point is less than a preset duration threshold T5, where the duration threshold may be 2 seconds, 5 seconds, 10 seconds, or the like, and may be preset based on experience or an experiment) and close in space (for example, a distance between the end point and the start point is less than a preset distance threshold L1, where the distance threshold L1 may be 1 meter, 3 meters, 5 meters, or the like, and may be preset based on experience or an experiment), to obtain the complete track of the single target in the key traffic scenario F1. In other words, a track whose end point and a track whose start point are close in time and space may be spliced, to obtain the complete track of the single target in the key traffic scenario F1.

Figure 6:
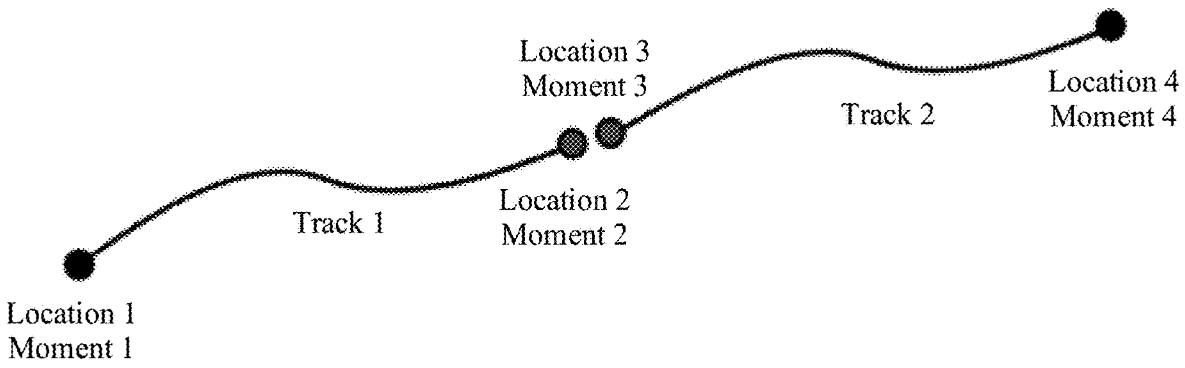
FIG. 6 is a schematic diagram of adjacent tracks of a single target according to an embodiment of this application.

For example, refer to FIG. 6. A location of a start point of a track 1 in a spatial dimension may be set to a location 1, and a location of the start point in a time dimension may be set to a moment 1. Alternatively, a location of an end point of the track 1 in the spatial dimension may be set to a location 2, and a location of the end point in the time dimension may be set to a moment 2. Alternatively, a location of a start point of a track 2 in the spatial dimension may be set to a location 3, and a location of the start point in the time dimension may be set to a moment 3. Alternatively, a location of an end point of the track 2 in the spatial dimension may be set to a location 4, and a location of the end point in the time dimension may be set to a moment 4. Assuming that the location 2 and the location 3 are close to each other (for example, a distance is less than the preset distance threshold L1), and the moment 2 and the moment 3 are close to each other (for example, a time difference is less than the preset duration threshold T5), the track 1 and the track 2 can be spliced into one track.

In the foregoing manner, a plurality of tracks included in the data G1 may be spliced into one or more tracks.

Back to FIG. 5. The computing device C1 may further perform step 503 to remove an unreasonable sensing target. In other words, the unreasonable sensing target is not considered in subsequent steps.

For example, the unreasonable sensing target may be a sensing target corresponding to a track that does not conform to common sense or experience, for example, a track of a particularly short length (for example, less than a preset length threshold L2, where the length threshold L2 may be 1 meter, 5 meters, 10 meters, or the like, and may be preset based on experience or an experiment).

For example, the unreasonable sensing target may refer to a sensing target corresponding to a track on which any point is far away from the vehicle D1 (namely, the ego vehicle) (for example, greater than a preset distance threshold L3, where the distance threshold L3 may be 100 meters, 150 meters, 200 meters, or the like, and may be preset based on experience or an experiment).

Still refer to FIG. 5. The computing device C1 may perform step 504 to determine a size and a type of the sensing target. The size may refer to a geometrical size. That is, the size of the sensing target may refer to a size and a shape of the sensing target in space. The type may refer to an object type. For example, the type may include a pedestrian, a bicycle, a car, a train, a traffic signal light, a landscape tree, a barricade, or the like. For example, the perception system of the vehicle D1 may determine the size and the type of the sensing target. Therefore, in step 504, the size and the type of the sensing target may be directly obtained.

The computing device C1 may further perform step 505 to separate a moving target from a stationary target. In other words, in step 504, it is determined which sensing targets are moving targets and which sensing targets are stationary targets. For example, whether a sensing target is a moving target may be determined based on a track of the sensing target. For example, if a distance between a start point and an end point of the track of the sensing target is sufficiently large (for example, may be greater than a preset distance threshold L4, where the distance threshold L4 may be 5 meters, 10 meters, 20 meters, or the like, and may be preset based on experience or an experiment), the sensing target may be determined as a moving target. If the distance between the start point and the end point of the track of the sensing target is not sufficiently large, the sensing target may be determined as a stationary target. For example, whether a sensing target is a moving target may be determined based on a speed of the sensing target. If a value of the speed of the sensing target is sufficiently large (may be greater than a preset speed threshold V1, where the speed threshold V1 may be 1 m/s, 3 m/s, or the like, and may be preset based on experience or an experiment), the sensing target may be determined as a moving target. Otherwise, the sensing target may be determined as a stationary target.

For any sensing target H1, the computing device C1 may perform step 506 to determine whether the sensing target H1 is a stationary target.

If a determining result is no, step 507*a* may be performed to fit a track of the sensing target H1. It may be understood that, a target track obtained through sensing by a perception system of an autonomous vehicle is generally irregular, and after track splicing is performed, a spatial curve and a speed curve of the track may be further fitted and smoothed. For example, in step 507*a*, one or more smoothing filtering algorithms of Fourier filtering, Bezier curve filtering, polynomial filtering, and the like may be used to fit and smooth the spatial curve and the speed curve of the track.

Refer to step 507*a*. Track fitting may also be performed on another moving target.

After step 507*a*, the computing device C1 may further perform step 508*a* to output information about the moving target.

If the determining result of step 506 is yes, the computing device C1 may further perform step 507*b* to determine a location and an orientation of the sensing target H1. Then, step 508*b* may be performed to output information about the stationary target.

The information about the moving target output in step 508*a* and the information about the stationary target output in step 508*b* may be used to synthesize or participate in synthesizing the simulation traffic scenario file.

In some embodiments, the sensing target sensed by the perception system may include information such as a type, a status, and a location of the traffic signal light. For example, when generating the simulation traffic scenario file, the computing device C1 may extract information about a traffic signal light within an appropriate range (for example, a distance from the location is less than a distance threshold L5, and the distance threshold L5 may be preset, for example, may be 100 meters or 200 meters) of a location of the vehicle D1 at the moment T1, for example, may extract information of a traffic signal light in an appropriate range of each location in the key traffic scenario F1. The extracted information of the traffic signal light may participate in synthesizing the simulation traffic scenario file.

The foregoing solution can be used to fully obtain the information of the sensing target in the key traffic scenario F1.

In some embodiments, the obtained information of the sensing target and information such as the start moment, the moment T1, the injection trigger condition, and the end moment in the embodiment shown in FIG. 3 may be stored in a file format required by one or more simulation test platforms, to obtain the simulation traffic scenario file or the description file of the simulation traffic scenario.

In some embodiments, the computing device C1 may directly reproduce the key traffic scenario F1 based on the obtained information of the sensing target and information such as the start moment, the moment T1, the injection trigger condition, and the end moment in the embodiment shown in FIG. 3.

Figure 7:
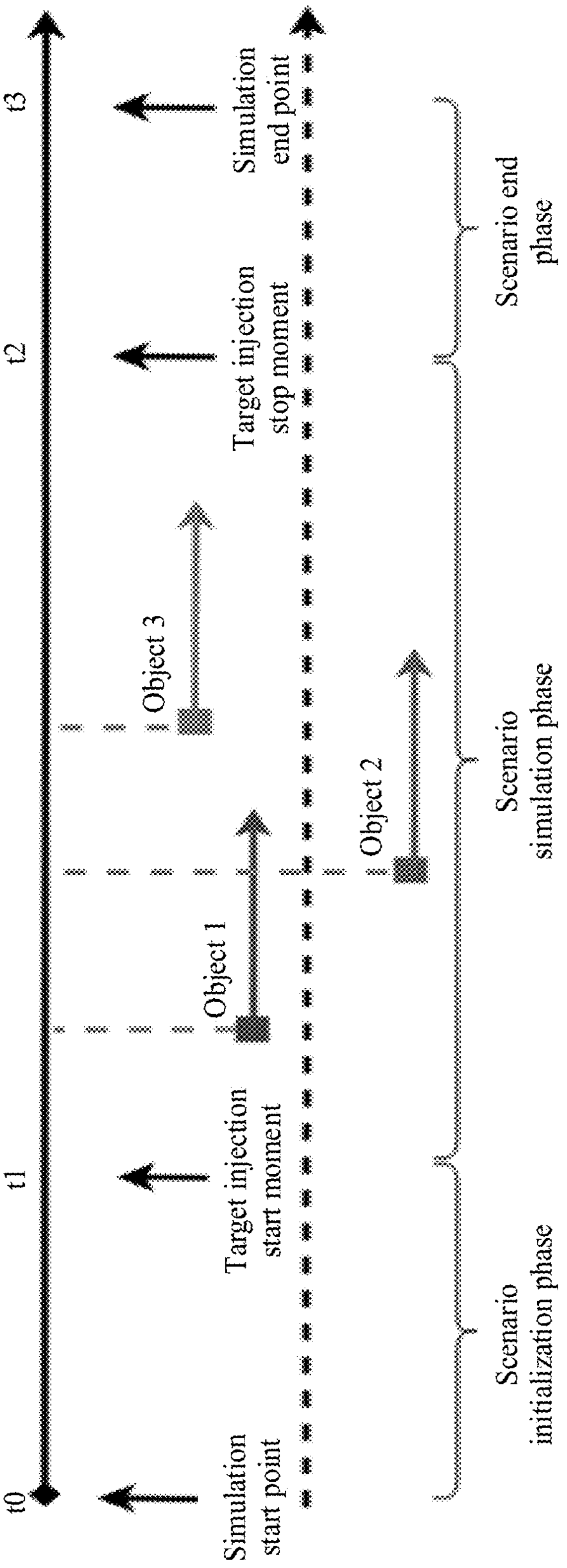
FIG. 7 is a schematic diagram of key traffic scenario reproduction according to an embodiment of this application.

In some embodiments, a process of reproducing the key traffic scenario F1 may be shown in FIG. 7.

A period from t0 to t1 is a scenario initialization process. In this embodiment, when the simulation test is performed, the simulation vehicle may be required to reach a state of the vehicle D1 during the road test when a scenario injection moment (which may also be referred to as a scenario trigger moment) arrives. During t0 to t1, the simulation vehicle may accelerate to reach a vehicle speed of the vehicle D1 at the scenario injection moment. In another embodiment, the scenario initialization process may be omitted.

In a scenario simulation phase (which may also be referred to as a key scenario phase), a sensing target such as a target 1, a target 2, and a target 3 may be injected. After the target is injected, a target status is updated based on a track and a speed curve. In addition, when the vehicle arrives at a location, information of a traffic signal light corresponding to the location may be injected. The traffic signal light corresponding to the location refers to a traffic signal light within an appropriate range of the location described above. A start point of the scenario simulation phase is a target injection start moment t1, namely, the injection moment described above. An end point of the scenario simulation phase is a target injection stop moment t2. The target injection stop moment t2 may be the moment T1, or the simulation moment of the moment T1.

According to the simulation traffic scenario file generation method provided in this embodiment of this application, a key scenario that is proposed based on drive test big data may be automatically extracted, and a data amount of scenario description information formed by using a reproduction method is far less than original drive test data, so that drive test core data is greatly compressed (a compression ratio is about 1000:1). In addition, a "real" key scenario can be automatically constructed based on drive test data in the key scenario. This ensures completeness and adequacy of a test verification scenario. In addition, the simulation traffic scenario file obtained in this application may be used to construct a real autonomous driving scenario. This greatly accelerates a scenario construction process, ensures authenticity of the scenario, forms a scenario database, ensures efficient utilization of an effective drive test scenario, and accelerates algorithm iteration of an autonomous driving system. In addition, the simulation traffic scenario file obtained in this application may be used for construction of a new scenario and a generalization input, so as to provide a basis for rationality of the new scenario.

The following uses an example to describe the solutions of this application.

Figure 8:
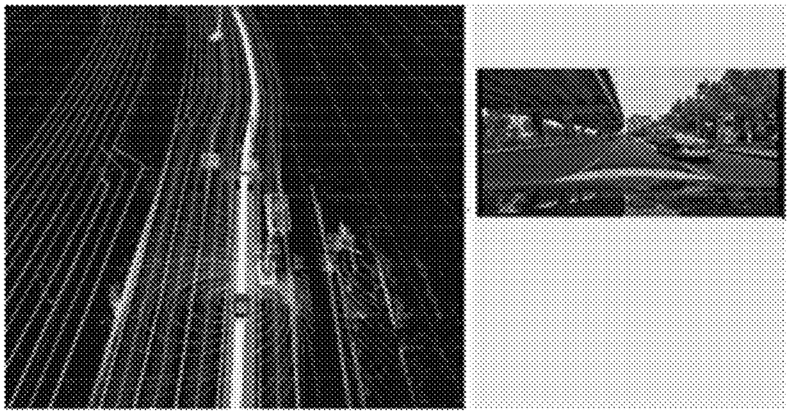
FIG. 8 is an interaction diagram of a key traffic scenario according to an embodiment of this application.

FIG. 8 shows an interaction picture of a key traffic scenario. An ego vehicle drives straight, and another vehicle on the right front makes a prompt of lane changing because a stationary bus in front of the vehicle occupies the lane. An autonomous driving algorithm of the ego vehicle fails to identify the intention, causing a collision hazard, so that an active takeover happens.

Figure 9:
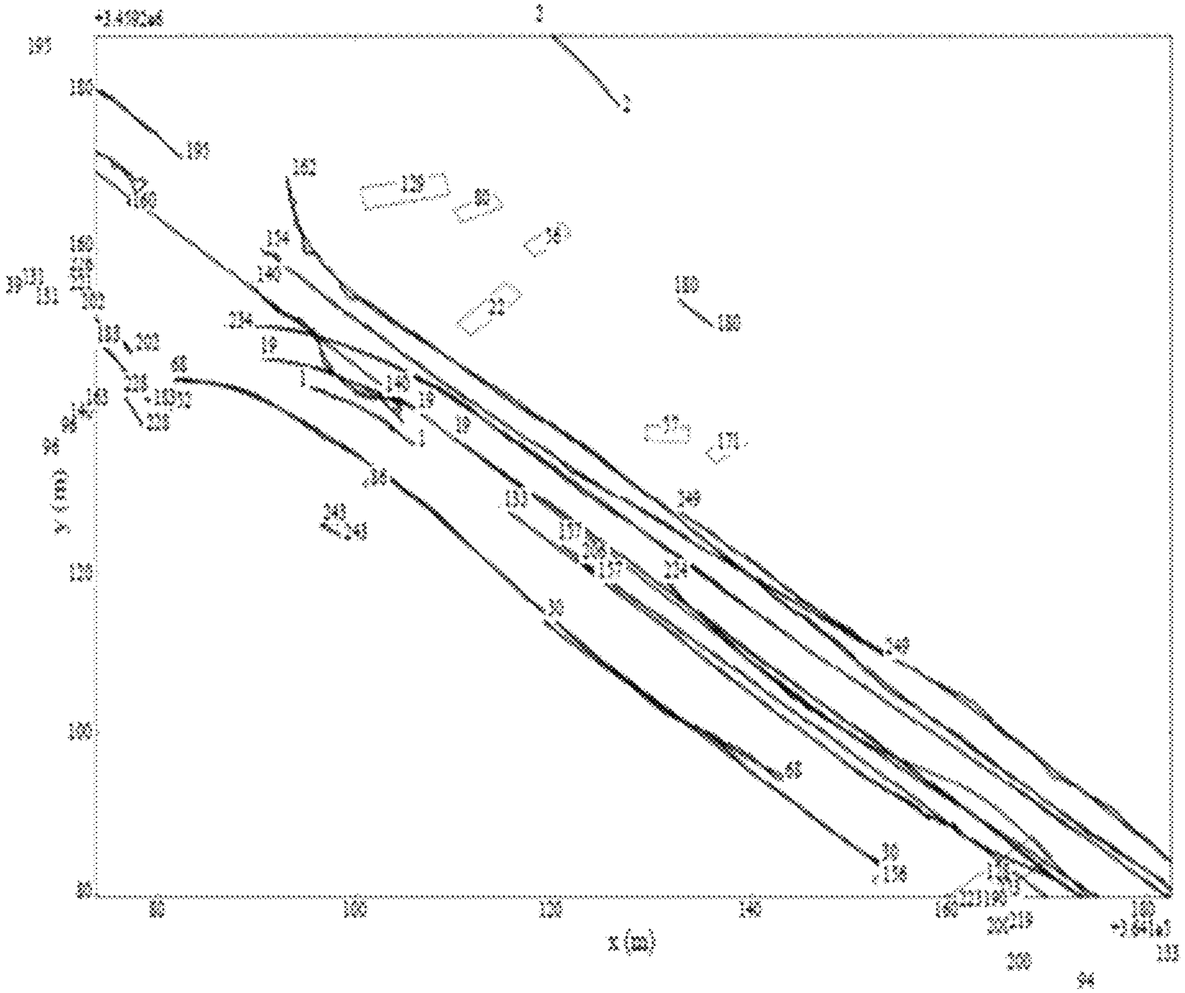
FIG. 9 shows a splicing result of tracks of a sensing target.
Figure 10:
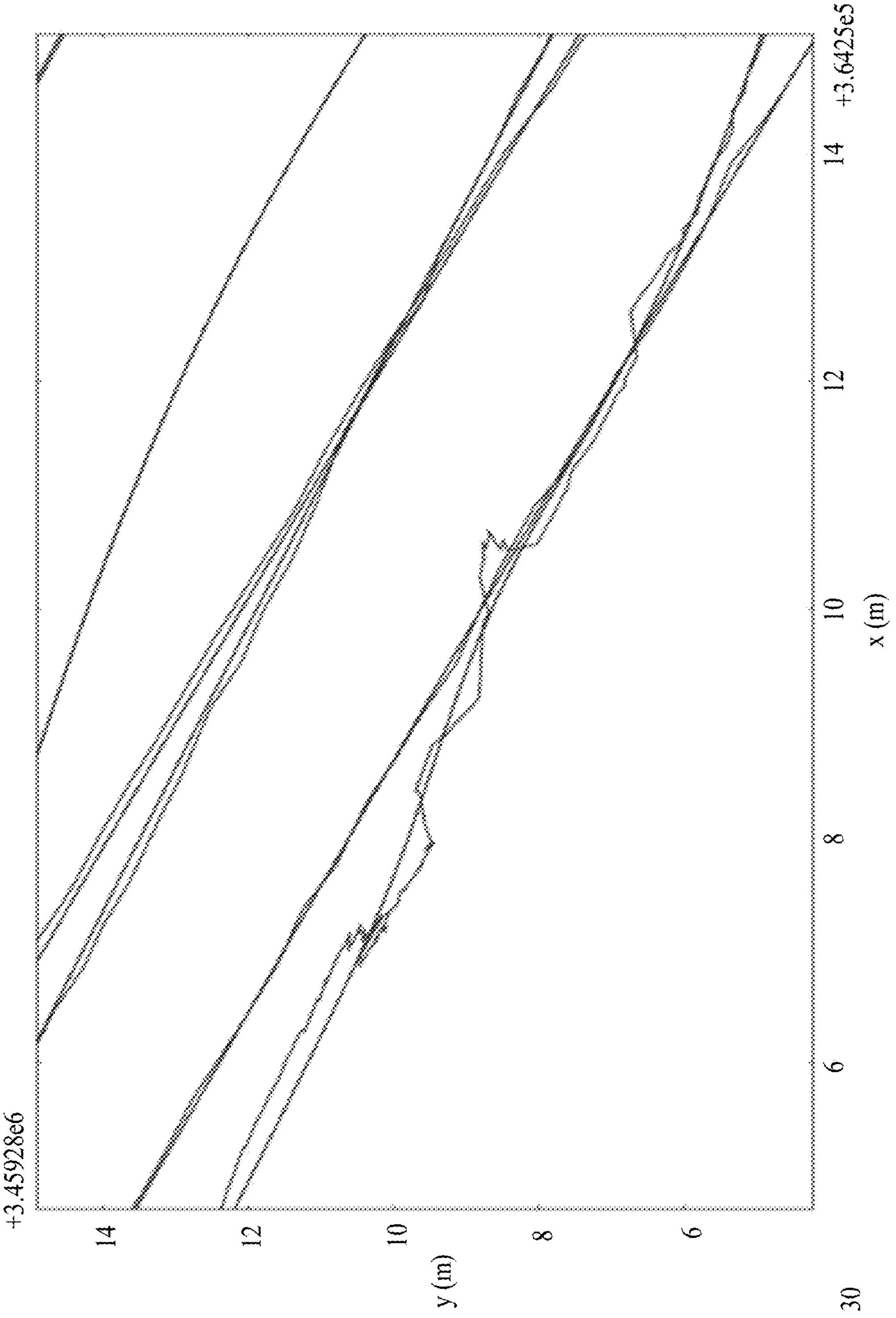
FIG. 10 shows a spatial curve fitting and smoothing result of a spliced track of a sensing target.
Figure 11:
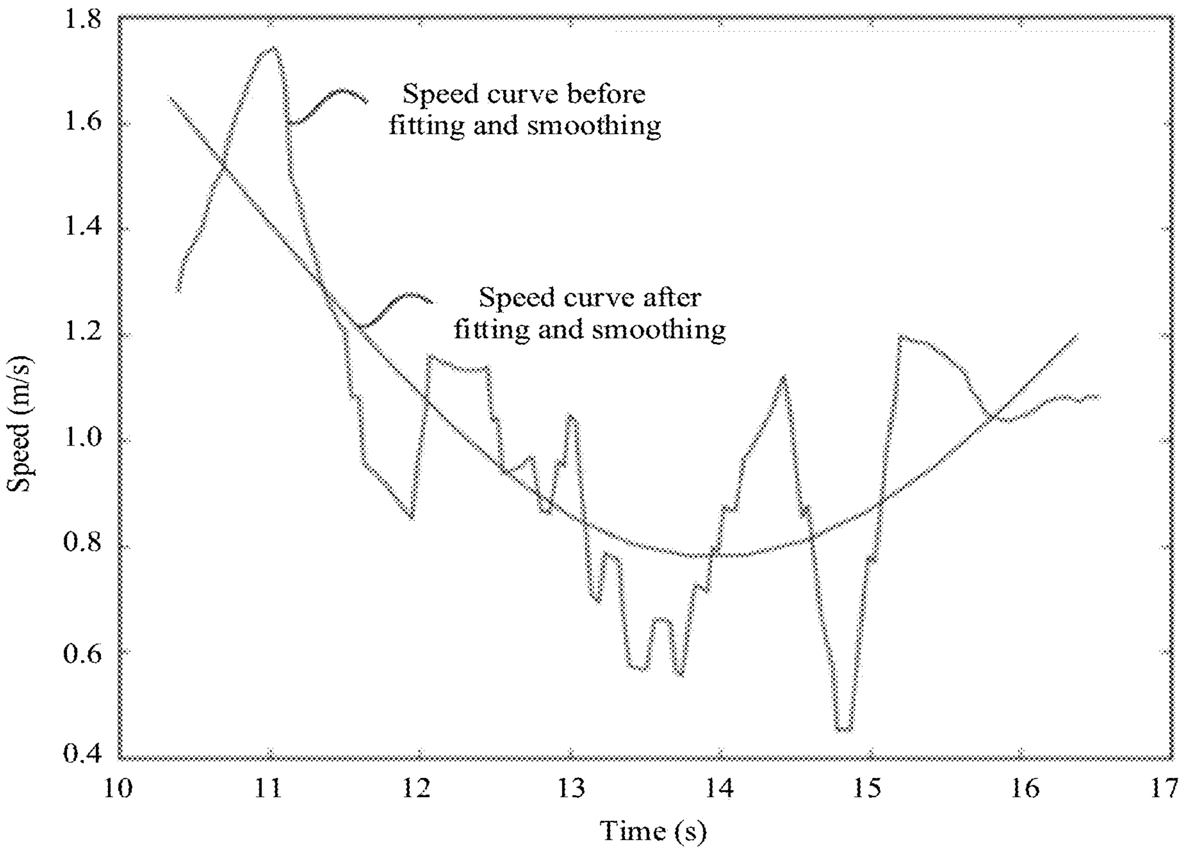
FIG. 11 shows a speed curve fitting and smoothing result of a spliced track of a sensing target.
Figure 12:
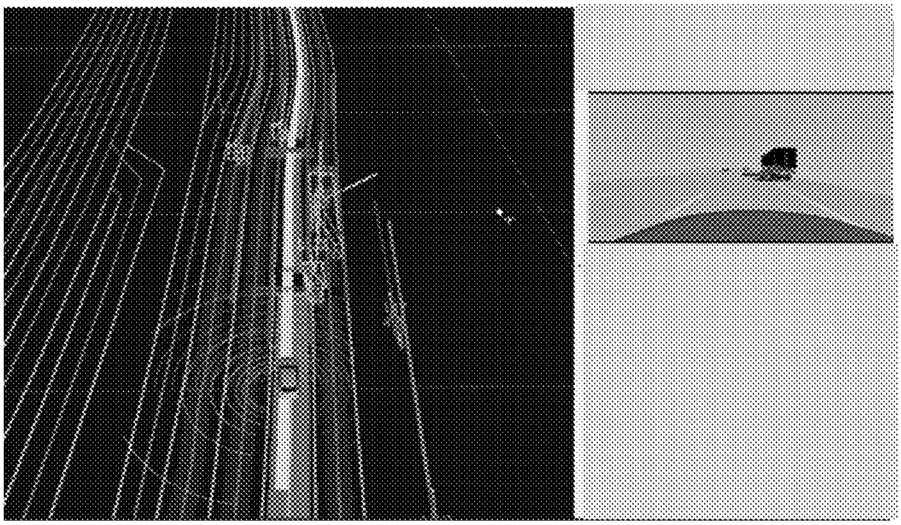
FIG. 12 shows a reproduced key traffic scenario.

According to the foregoing solution, a start moment, an injection trigger condition, an end moment, and the like of the key traffic scenario may be determined, and tracks of a sensing target may be spliced, fitted and smoothed. FIG. 9 shows a splicing result of tracks of the sensing target. FIG. 10 shows a spatial curve fitting and smoothing result of a spliced track of the sensing target. FIG. 11 shows a speed curve fitting and smoothing result of the spliced track of the sensing target. FIG. 12 shows a reproduced key traffic scenario, that is, FIG. 12 shows a simulation scenario corresponding to the key traffic scenario.

In this way, it can be learned that the solution for generating a simulation traffic scenario file and reproducing a traffic scenario provided in this embodiment of this application can implement automatic extraction of a core scenario, and an extracted sensing target result is reasonable and adequate. The solution can realize accurate separation of stationary targets and moving targets, calculate a location and an orientation of the stationary target, and properly process a spatial track and speed curve of the moving target. In addition, it can be learned from a result shown in FIG. 12 that the scenario reproduction (or reproduction) method provided in this application can ensure reproduction (or reproduction) of a core interaction scenario.

Figure 13:
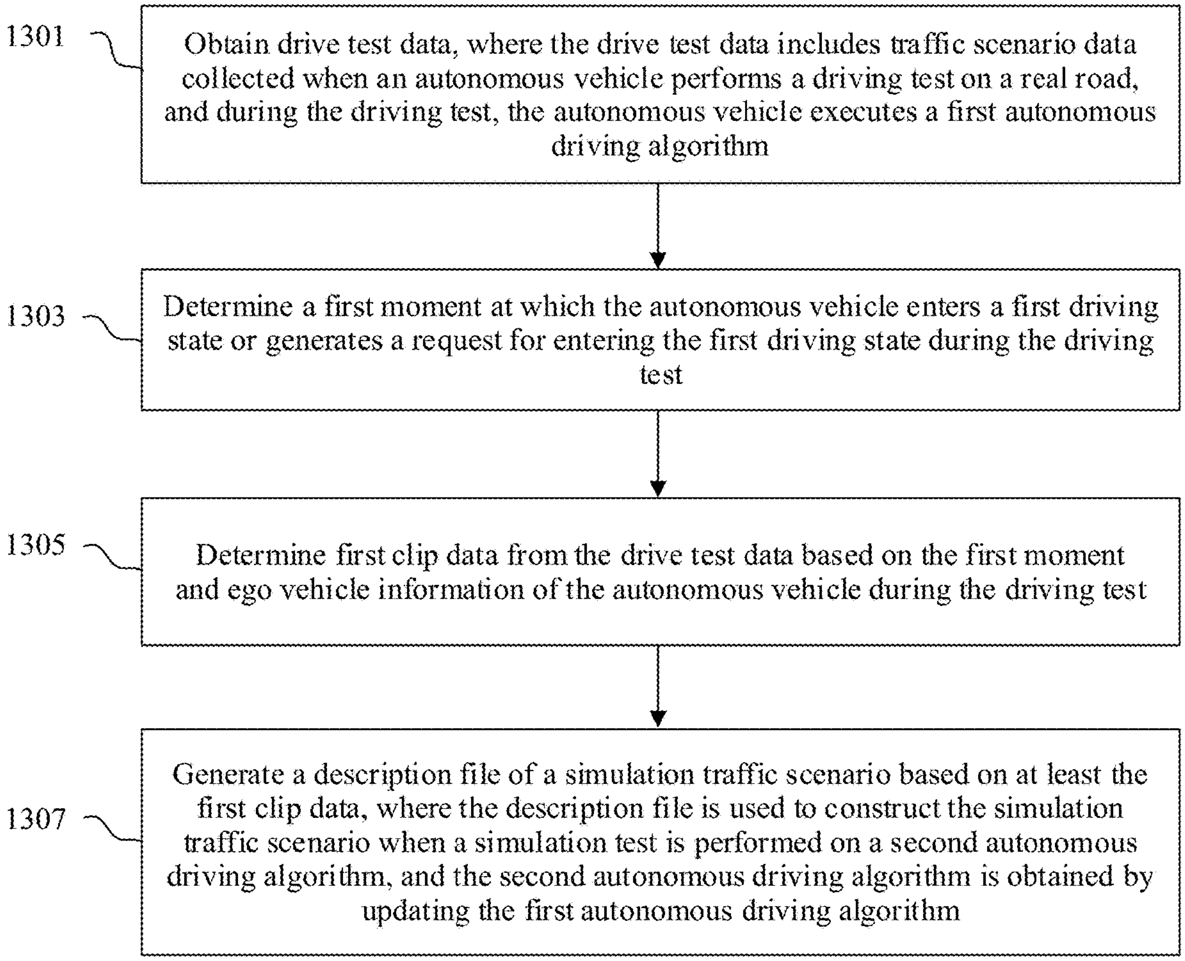
FIG. 13 is a flowchart of a simulation traffic scenario generation method according to an embodiment of this application.

According to the foregoing description, an embodiment of this application provides a simulation traffic scenario file generation method, and the method may be applied to any apparatus, device, platform, or device cluster that has data computing and processing capabilities, for example, the computing device C1. Refer to FIG. 13, the method may include the following steps.

Step 1301: Obtain drive test data, where the drive test data includes traffic scenario data collected when an autonomous vehicle performs a driving test on a real road, and during the driving test, the autonomous vehicle executes a first autonomous driving algorithm.

Step 1303: Determine a first moment at which the autonomous vehicle enters a first driving state or generates a request for entering the first driving state during the driving test.

Step 1305: Determine first clip data from the drive test data based on the first moment and ego vehicle information of the autonomous vehicle during the driving test.

Step 1307: Generate a description file of a simulation traffic scenario based on at least the first clip data, where the description file is used to construct the simulation traffic scenario when a simulation test is performed on a second autonomous driving algorithm, and the second autonomous driving algorithm is obtained by updating the first autonomous driving algorithm.

In some embodiments, the first driving state includes a manual driving state or an autonomous emergency braking state.

In some embodiments, the first clip data is data collected by the autonomous vehicle in a first time period during the driving test, and the first time period includes the first moment.

In a first example of these embodiments, the ego vehicle information includes a target tracking range of the autonomous vehicle, and when a distance between another sensing target and the autonomous vehicle is less than the target tracking range, the autonomous vehicle determines the another sensing target as a tracking target. The step 1305 includes: determining a second moment based on the target tracking range and the first moment of the autonomous vehicle, where the second moment is earlier than the first moment, and a distance between a position of the autonomous vehicle at the second moment and a position of the autonomous vehicle at the first moment is equal to the target tracking range; and determining the second moment as a start moment of the first time period.

In a second example of these embodiments, the ego vehicle information includes a target tracking range of the autonomous vehicle and a vehicle speed of the autonomous vehicle during the driving test, and when a distance between another sensing target and the autonomous vehicle is less than the target tracking range, the autonomous vehicle determines the another sensing target as a tracking target. The step 1305 includes: determining a second moment based on the target tracking range and the first moment of the autonomous vehicle, where the second moment is earlier than the first moment, and a distance between a position of the autonomous vehicle at the second moment and a position of the autonomous vehicle at the first moment is equal to the target tracking range; and determining a start moment of the first time period based on the second moment and a first vehicle speed of the autonomous vehicle at the second moment.

In an example of the second example, the method embodiment shown in FIG. 13 may further include: obtaining a preset acceleration; and the determining a start moment of the first time period based on the second moment and a first vehicle speed of the autonomous vehicle at the second moment includes: determining the start moment based on the acceleration, the second moment, and the first vehicle speed, so that a speed to which the autonomous vehicle starts to accelerate from the start moment to the second moment according to the acceleration in a case in which a start speed is zero is equal to the first vehicle speed.

In a third example of these embodiments, the method embodiment shown in FIG. 13 may further include: obtaining first ego vehicle information of the autonomous vehicle corresponding to the first time period; and the generating a description file of a simulation traffic scenario based on at least the first clip data includes generating the simulation traffic scenario based on the first clip data and the first ego vehicle information.

In some embodiments, the first clip data includes a plurality of tracks corresponding to a same target category. The step 1307 may further include splicing different tracks in the plurality of tracks to obtain at least one spliced track, where when a distance between an end position of a first track in the plurality of tracks and a start position of a second track in the plurality of tracks is less than a first threshold, and a time difference between an end moment of the first track and a start moment of the second track is less than a second threshold, an end point of the first track and a start point of the second track are spliced to obtain a spliced track; and generating the simulation traffic scenario based on the at least one spliced track.

The simulation traffic scenario file generation method provided in this embodiment of this application can be used to automatically extract data of a key traffic scenario from the drive test data, and generate the description file used to describe the simulation traffic scenario, so as to reproduce a real key traffic scenario, thereby ensuring authenticity, completeness, and adequacy of a scenario tested or verified by an autonomous driving algorithm. A data amount of the description file is far less than the drive test data (generally, the data amount of the description file is less than or equal to one thousandth of the drive test data). In addition, the method can be used to quickly generate the description file of the simulation traffic scenario, which can speed up a scenario construction process. The generated description file can be used to form a scenario database, which ensures efficient utilization of the key traffic scenario in a drive test, and further accelerates iteration of the autonomous driving algorithm. The description file can be also used for construction of a new scenario and a generalization input, which provides a basis for rationality of the new scenario.

Figure 14:
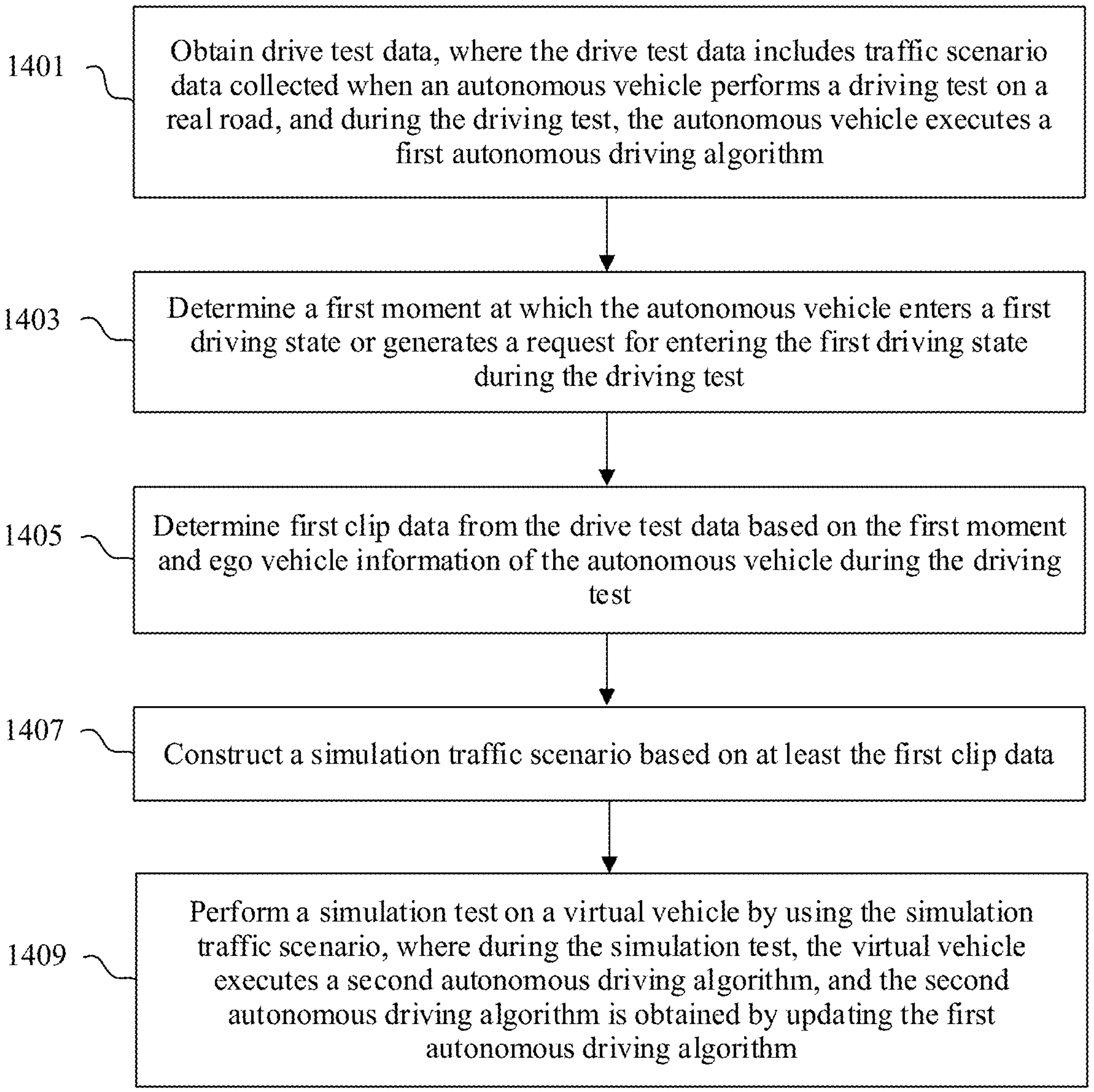
FIG. 14 is a flowchart of a traffic scenario simulation method according to an embodiment of this application.

According to the foregoing content, an embodiment of this application further provides a traffic scenario simulation method, and the method may be applied to any apparatus, device, platform, or device cluster that has data computing and processing capabilities, for example, the computing device C2. Refer to FIG. 14, the method may include the following steps.

Step 1401: Obtain drive test data, where the drive test data includes traffic scenario data collected when an autonomous vehicle performs a driving test on a real road, and during the driving test, the autonomous vehicle executes a first autonomous driving algorithm.

Step 1403: Determine a first moment at which the autonomous vehicle enters a first driving state or generates a request for entering the first driving state during the driving test.

Step 1405: Determine first clip data from the drive test data based on the first moment and ego vehicle information of the autonomous vehicle during the driving test.

Step 1407: Construct a simulation traffic scenario based on at least the first clip data.

Step 1409: Perform a simulation test on a virtual vehicle by using the simulation traffic scenario, where during the simulation test, the virtual vehicle executes a second autonomous driving algorithm, and the second autonomous driving algorithm is obtained by updating the first autonomous driving algorithm.

In some embodiments, the ego vehicle information includes a target tracking range of the autonomous vehicle, the first clip data is data collected by the autonomous vehicle in a first time period during the driving test, the first time period includes the first moment and a second moment, and a distance between a position of the autonomous vehicle at the first moment and a position of the autonomous vehicle at the second moment is less than or equal to the target tracking range. The simulation traffic scenario lasts for a second time period, and duration of the second time period is equal to duration of the first time period. The step 1409 may include: when the virtual vehicle is at a time point corresponding to the second moment in the second time period, determining a driving policy of the virtual vehicle based on a participating element in the simulation traffic scenario by using the second autonomous driving algorithm.

In an illustrative example of these embodiments, at least one data clip includes a first vehicle speed of the autonomous vehicle at the second moment. The step 1409 may include: when a start speed of the virtual vehicle is zero, accelerating according to a preset acceleration starting from a start moment of the second time period, so that a speed of the virtual vehicle at the time point corresponding to the second moment in the second time period is equal to the first vehicle speed.

The traffic scenario simulation method provided in this embodiment of this application can be used to automatically extract data of a key traffic scenario from the drive test data, construct the simulation traffic scenario based on the data, and test or verify an autonomous driving algorithm, so as to ensure authenticity, completeness, and adequacy of a scenario tested or verified by the autonomous driving algorithm. In addition, the method can be used to quickly construct the simulation traffic scenario, which ensures efficient utilization of the key traffic scenario in a drive test, and further accelerates iteration of the autonomous driving algorithm.

It should be noted that, for brief description, the foregoing method embodiments are represented as a series of actions. However, a person skilled in the art should appreciate that the present disclosure is not limited to the described action sequence, because according to this application, some steps may be performed in other sequences or performed simultaneously. It should be further appreciated by the person skilled in the art that the embodiments described in this specification all belong to preferred embodiments, and the involved actions and modules are not necessarily required in this application.

In the foregoing embodiments, descriptions of the embodiments have respective focuses. For a part that is not described in detail in an embodiment, refer to related descriptions in other embodiments.

Figure 15:
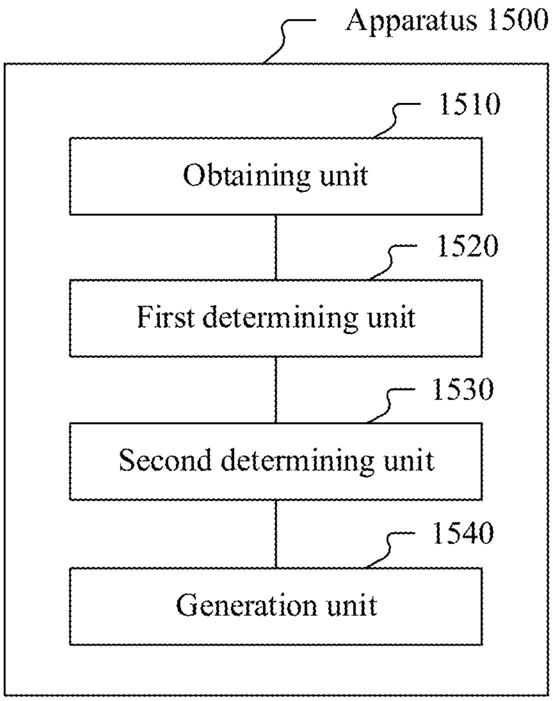
FIG. 15 is a schematic diagram of a simulation traffic scenario generation apparatus according to an embodiment of this application.

Refer to FIG. 15. An embodiment of this application provides a simulation traffic scenario file generation apparatus 1500. As shown in FIG. 15, the apparatus 1500 includes: an obtaining unit 1510, configured to obtain drive test data, where the drive test data includes traffic scenario data collected when an autonomous vehicle performs a driving test on a real road, and during the driving test, the autonomous vehicle executes a first autonomous driving algorithm; a first determining unit 1520, configured to determine a first moment at which the autonomous vehicle enters a first driving state or generates a request for entering the first driving state during the driving test; a second determining unit 1530, configured to determine first clip data from the drive test data based on the first moment and ego vehicle information of the autonomous vehicle during the driving test; and a generation unit 1550, configured to generate a description file of a simulation traffic scenario based on at least the first clip data, where the description file is used to construct the simulation traffic scenario when a simulation test is performed on a second autonomous driving algorithm, and the second autonomous driving algorithm is obtained by updating the first autonomous driving algorithm.

For functions of function units of the simulation traffic scenario file generation apparatus provided in this embodiment of this application, refer to the foregoing method embodiments shown in FIG. 13. Details are not described herein again.

Figure 16:
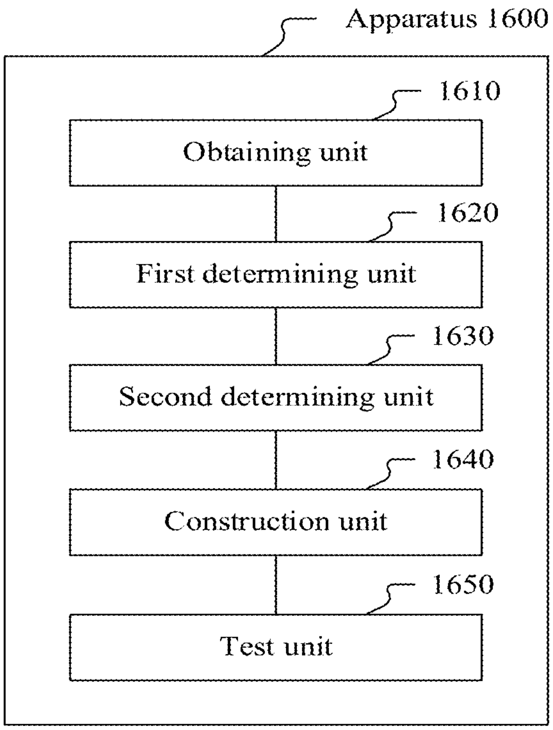
FIG. 16 is a schematic diagram of a traffic scenario simulation apparatus according to an embodiment of this application.

Refer to FIG. 16. An embodiment of this application provides a traffic scenario simulation apparatus 1600. As shown in FIG. 16, the apparatus 1600 includes: an obtaining unit 1610, configured to obtain drive test data, where the drive test data includes traffic scenario data collected when an autonomous vehicle performs a driving test on a real road, and during the driving test, the autonomous vehicle executes a first autonomous driving algorithm; a first determining unit 1620, configured to determine a first moment at which the autonomous vehicle enters a first driving state or generates a request for entering the first driving state during the driving test; a second determining unit 1630, configured to determine first clip data from the drive test data based on the first moment and ego vehicle information of the autonomous vehicle during the driving test; a construction unit 1640, configured to construct a simulation traffic scenario based on at least the first clip data; and a test unit 1650, configured to perform a simulation test on a virtual vehicle by using the simulation traffic scenario, where during the simulation test, the virtual vehicle executes a second autonomous driving algorithm, and the second autonomous driving algorithm is obtained by updating the first autonomous driving algorithm.

For functions of function units of the traffic scenario simulation apparatus provided in this embodiment of this application, refer to the foregoing method embodiments shown in FIG. 14. Details are not described herein again.

In the several embodiments provided in this application, it should be understood that the disclosed apparatuses may be implemented in other manners. For example, the described apparatus embodiment is merely an example. For example, the module division is merely logical function division and may be other division in actual implementation. For example, a plurality of modules or components may be combined or integrated into another system, or some features may be ignored or not performed. In addition, the displayed or discussed mutual couplings or direct couplings or communication connections may be implemented through some interfaces. The indirect couplings or communication connections between the apparatuses or modules may be implemented in electrical or other forms.

Figure 17:
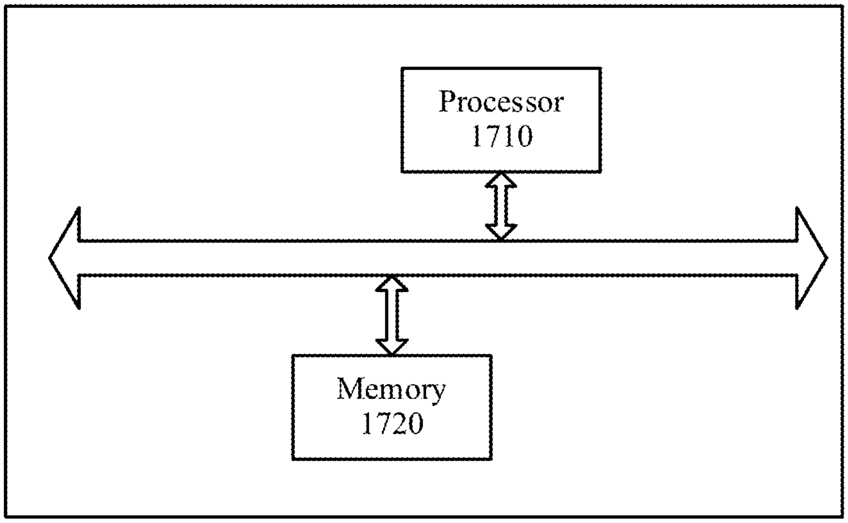
FIG. 17 is a schematic block diagram of a computing device according to an embodiment of this application.

An embodiment of this application provides a computing device. Refer to FIG. 17. The computing device includes a processor 1710 and a memory 1720. While only one processor 1710 is shown, multiple processors may be present. Thus, while instructions may be discussed as executed by the processor 1710, the instructions may be executed simultaneously, serially, or otherwise executed by one or multiple processors. The memory is configured to store computer-executable instructions. When the computing device runs, the processor 1710 executes the computer-executable instructions stored in the memory 1720 such that the computing device performs the method shown in FIG. 13. The processor 1710 is configured to obtain drive test data, where the drive test data includes traffic scenario data collected when an autonomous vehicle performs a driving test on a real road, and during the driving test, the autonomous vehicle executes a first autonomous driving algorithm. The processor 1710 is further configured to determine a first moment at which the autonomous vehicle enters a first driving state or generates a request for entering the first driving state during the driving test. The processor 1710 is further configured to determine first clip data from the drive test data based on the first moment and ego vehicle information of the autonomous vehicle during the driving test. The processor 1710 is further configured to generate a description file of a simulation traffic scenario based on at least the first clip data, where the description file is used to construct the simulation traffic scenario when a simulation test is performed on a second autonomous driving algorithm, and the second autonomous driving algorithm is obtained by updating the first autonomous driving algorithm.

For specific implementations of components/devices of the computing device in this embodiment of this application, refer to the foregoing method embodiment shown in FIG. 13. Details are not described herein again.

An embodiment of this application provides a computing device. Still refer to FIG. 17. The computing device includes a processor 1710 and a memory 1720. The memory is configured to store computer-executable instructions. When the computing device runs, the processor 1710 executes the computer-executable instructions stored in the memory 1720, so that the computing device performs the method shown in FIG. 14. The processor 1710 is configured to obtain drive test data, where the drive test data includes traffic scenario data collected when an autonomous vehicle performs a driving test on a real road, and during the driving test, the autonomous vehicle executes a first autonomous driving algorithm. The processor 1710 is further configured to determine a first moment at which the autonomous vehicle enters a first driving state or generates a request for entering the first driving state during the driving test. The processor 1710 is further configured to determine first clip data from the drive test data based on the first moment and ego vehicle information of the autonomous vehicle during the driving test. The processor 1710 is further configured to construct a simulation traffic scenario based on at least the first clip data. The processor 1710 is further configured to perform a simulation test on a virtual vehicle by using the simulation traffic scenario, where during the simulation test, the virtual vehicle executes a second autonomous driving algorithm, and the second autonomous driving algorithm is obtained by updating the first autonomous driving algorithm.

For specific implementations of components/devices of the computing device in this embodiment of this application, refer to the foregoing method embodiment shown in FIG. 14. Details are not described herein again.

It may be understood that the processor in the embodiments of this application may be a central processing unit (CPU), or may be another general-purpose processor, a digital signal processor (DSP), an application-specific integrated circuit (ASIC), a field-programmable gate array (FPGA), or another programmable logic device, a transistor logic device, a hardware component, or any combination thereof. The general-purpose processor may be a microprocessor or any conventional processor.

The method steps in the embodiments of this application may be implemented by hardware, or may be implemented by a processor executing software instructions. The software instructions may include corresponding software modules. The software modules may be stored in a random-access memory (RAM), a flash memory, a read-only memory (ROM), a programmable ROM (PROM), an erasable PROM (EPROM), an electrically EPROM (EEPROM), a register, a hard disk, a removable hard disk, a compact disc (CD)-ROM, or any other form of storage medium well-known in the art. For example, a storage medium is coupled to a processor, so that the processor can read information from the storage medium or write information into the storage medium. Certainly, the storage medium may be a component of the processor. The processor and the storage medium may be located in the ASIC.

All or some of the foregoing embodiments may be implemented by using software, hardware, firmware, or any combination thereof. When software is used to implement the embodiments, all or some of the embodiments may be implemented in a form of a computer program product. The computer program product includes one or more computer instructions. When the computer program instructions are loaded and executed on a computer, all or some of the procedures or functions according to the embodiments of this application are generated. The computer may be a general-purpose computer, a dedicated computer, a computer network, or another programmable apparatus. The computer instructions may be stored in a computer-readable storage medium, or may be transmitted by using the computer-readable storage medium. The computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a Digital Versatile Disc (DVD)), a semiconductor medium (for example, a solid-state drive (SSD)), or the like.

It may be understood that numerical symbols in the embodiments of this application are differentiated merely for ease of description, but are not used to limit the scope of the embodiments of this application.

What is claimed is:

1. A method for simulating a key traffic scenario to ensure completeness of a simulation test, comprising:

obtaining drive test data comprising traffic scenario data, wherein the traffic scenario data is from an autonomous vehicle when the autonomous vehicle performs a driving test and executes a first autonomous driving algorithm during the driving test;

determining a first moment at which the autonomous vehicle enters a first driving state or generates a request for entering the first driving state during the driving test;

determining clip data from the drive test data based on the first moment and ego vehicle information of the autonomous vehicle during the driving test; and generating a description file of a simulation traffic scenario based on the clip data when the simulation test is performed on a second autonomous driving algorithm, wherein the second autonomous driving algorithm is based on the first autonomous driving algorithm, wherein the simulation traffic scenario comprises the key traffic scenario which is determined by an injection trigger condition on a real road, and wherein generating the description file further comprises:

splicing an end point of a first track in tracks and a start point of a second track in the tracks to obtain a spliced track when a distance between an end position of the first track and a start position of the second track is less than a first threshold and when a time difference between an end moment of the first track and a first start moment of the second track is less than a second threshold; and generating the simulation traffic scenario based on the spliced track.

2. The method of claim 1, wherein the first driving state is a manual driving state or an autonomous emergency braking state.

3. The method of claim 1, wherein the clip data is from the autonomous vehicle in a first time period during the driving test, and wherein the first time period comprises the first moment.

4. The method of claim 3, wherein the ego vehicle information comprises a target tracking range of the autonomous vehicle, and wherein the method further comprises:

determining a sensing target as a tracking target when a first distance between the sensing target and the autonomous vehicle is less than the target tracking range;

determining a second moment based on the target tracking range and the first moment of the autonomous vehicle, wherein the second moment is earlier than the first moment, and wherein a second distance between a first position of the autonomous vehicle at the second moment and a second position of the autonomous vehicle at the first moment is equal to the target tracking range; and determining the second moment as a start moment of the first time period.

5. The method of claim 3, wherein the ego vehicle information comprises a target tracking range of the autonomous vehicle and a vehicle speed of the autonomous vehicle during the driving test, and wherein the method further comprises:

determining a sensing target as a tracking target when a first distance between the sensing target and the autonomous vehicle is less than the target tracking range;

determining a second moment based on the target tracking range and the first moment of the autonomous vehicle, wherein the second moment is earlier than the first moment, and wherein a second distance between a first position of the autonomous vehicle at the second moment and a second position of the autonomous vehicle at the first moment is equal to the target tracking range; and determining a start moment of the first time period based on the second moment and a first vehicle speed of the autonomous vehicle at the second moment.

6. The method of claim 5, further comprising:

obtaining a preset acceleration; and further determining the start moment based on the preset acceleration, the second moment, and the first vehicle speed.

7. The method of claim 3, further comprising:

obtaining first ego vehicle information of the autonomous vehicle corresponding to the first time period; and generating the simulation traffic scenario based on the clip data and the first ego vehicle information.

8. The method of claim 1, wherein the clip data comprises the tracks corresponding to a same target category.

9. A method for simulating a key traffic scenario to ensure completeness of a simulation test, comprising:

obtaining drive test data comprising traffic scenario data collected when an autonomous vehicle performs a driving test and executes a first autonomous driving algorithm during the driving test;

determining a first moment at which the autonomous vehicle enters a first driving state or generates a request for entering the first driving state during the driving test;

determining clip data from the drive test data based on the first moment and ego vehicle information of the autonomous vehicle during the driving test;

constructing a simulation traffic scenario based on the clip data; and performing the simulation test on a virtual vehicle using the simulation traffic scenario and a second autonomous driving algorithm, wherein the second autonomous driving algorithm is based on the first autonomous driving algorithm, wherein the simulation traffic scenario comprises the key traffic scenario determined by an injection trigger condition on a real road, and wherein constructing the simulation traffic scenario comprises:

splicing an end point of a first track in tracks and a start point of a second track in the tracks to obtain a spliced track when a first distance between an end position of the first track and a start position of the second track is less than a first threshold and when a time difference between an end moment of the first track and a first start moment of the second track is less than a second threshold; and constructing the simulation traffic scenario based on the spliced track.

10. The method of claim 9, wherein the ego vehicle information comprises a target tracking range of the autonomous vehicle, wherein the clip data is from the autonomous vehicle in a first time period during the driving test, wherein the first time period comprises the first moment and a second moment, wherein a distance between a first position of the autonomous vehicle at the first moment and a second position of the autonomous vehicle at the second moment is less than or equal to the target tracking range, wherein the simulation traffic scenario lasts for a second time period, wherein duration of the second time period is equal to duration of the first time period, and wherein performing the simulation test comprises determining a driving policy of the virtual vehicle based on a participating element in the simulation traffic scenario using the second autonomous driving algorithm when the virtual vehicle is at a time point corresponding to the second moment in the second time period.

11. The method of claim 10, wherein at least one data clip comprises a first vehicle speed of the autonomous vehicle at the second moment, and wherein performing the simulation test comprises accelerating according to a preset acceleration starting from a start moment of the second time period when a start speed of the virtual vehicle is zero such that a speed of the virtual vehicle at the time point corresponding to the second moment in the second time period is equal to the first vehicle speed.

12. The method of claim 9, wherein the first driving state is a manual driving state or an autonomous emergency braking state.

13. An apparatus for simulating a key traffic scenario to ensure completeness of a simulation test, comprising:

a memory configured to store instructions; and one or more processors coupled to the memory and configured to execute the instructions stored in the memory to cause the apparatus to:

obtain drive test data comprising traffic scenario data, wherein the traffic scenario data is from an autonomous vehicle when the autonomous vehicle performs a driving test and executes a first autonomous driving algorithm during the driving test;

determine a first moment at which the autonomous vehicle enters a first driving state or generates a request for entering the first driving state during the driving test;

determine clip data from the drive test data based on the first moment and ego vehicle information of the autonomous vehicle during the driving test; and generate a description file of a simulation traffic scenario based on the clip data when the simulation test is performed on a second autonomous driving algorithm, wherein the second autonomous driving algorithm is from the first autonomous driving algorithm, wherein the simulation traffic scenario comprises the key traffic scenario which is determined by an injection trigger condition on a real road, and wherein generating the description file further comprises:

splicing an end point of a first track in tracks and a start point of a second track in the tracks to obtain a spliced track when a distance between an end position of the first track and a start position of the second track is less than a first threshold and when a time difference between an end moment of the first track and a first start moment of the second track is less than a second threshold; and generating the simulation traffic scenario based on the spliced track.

14. The apparatus of claim 13, wherein the first driving state is a manual driving state or an autonomous emergency braking state.

15. The apparatus of claim 13, wherein the clip data is from the autonomous vehicle in a first time period during the driving test, and wherein the first time period comprises the first moment.

16. The apparatus of claim 15, wherein the ego vehicle information comprises a target tracking range of the autonomous vehicle, and wherein the one or more processors are configured to execute the instructions stored in the memory to further cause the apparatus to:

determine a sensing target as a tracking target when a first distance between the sensing target and the autonomous vehicle is less than the target tracking range:

determine a second moment based on the target tracking range and the first moment of the autonomous vehicle, wherein the second moment is earlier than the first moment, and a second distance between a first position of the autonomous vehicle at the second moment and a second position of the autonomous vehicle at the first moment is equal to the target tracking range; and determine the second moment as a start moment of the first time period.

17. The apparatus of claim 15, wherein the ego vehicle information comprises a target tracking range of the autonomous vehicle and a vehicle speed of the autonomous vehicle during the driving test, wherein the one or more processors are configured to execute the instructions stored in the memory to further cause the apparatus to:

determine a sensing target as a tracking target when a first distance between the sensing target and the autonomous vehicle is less than the target tracking range;

determine a second moment based on the target tracking range and the first moment of the autonomous vehicle, wherein the second moment is earlier than the first moment, and wherein a second distance between a first position of the autonomous vehicle at the second moment and a second position of the autonomous vehicle at the first moment is equal to the target tracking range; and determine a start moment of the first time period based on the second moment and a first vehicle speed of the autonomous vehicle at the second moment.

18. The apparatus of claim 17, wherein the one or more processors are configured to execute the instructions stored in the memory to further cause the apparatus to:

obtain a preset acceleration; and determine the start moment based on the preset acceleration, the second moment, and the first vehicle speed.

19. The apparatus of claim 15, wherein the one or more processors are configured to execute the instructions stored in the memory to further cause the apparatus to:

obtain first ego vehicle information of the autonomous vehicle corresponding to the first time period; and generate the simulation traffic scenario based on the clip data and the first ego vehicle information.

20. The apparatus of claim 13, wherein the clip data comprises the tracks corresponding to a same target category.

* * * * *